US007693710B2

(12) United States Patent
Jelinek et al.

(10) Patent No.: US 7,693,710 B2
(45) Date of Patent: Apr. 6, 2010

(54) METHOD AND DEVICE FOR EFFICIENT FRAME ERASURE CONCEALMENT IN LINEAR PREDICTIVE BASED SPEECH CODECS

(75) Inventors: Milan Jelinek, Sherbrooke (CA); Philippe Gournay, Sherbrooke (CA)

(73) Assignee: VoiceAge Corporation (CA)

( * ) Notice: Subject to any disclaimer, the term of this patent is extended or adjusted under 35 U.S.C. 154(b) by 1294 days.

(21) Appl. No.: 10/515,569

(22) PCT Filed: May 30, 2003

(86) PCT No.: PCT/CA03/00830

§ 371 (c)(1),
(2), (4) Date: Nov. 23, 2004

(87) PCT Pub. No.: WO03/102921

PCT Pub. Date: Dec. 11, 2003

(65) Prior Publication Data

US 2005/0154584 A1 Jul. 14, 2005

(30) Foreign Application Priority Data

May 31, 2002 (CA) .................................... 2388439

(51) Int. Cl.

| | |
|---|---|
| ***G10L 11/04*** | (2006.01) |
| ***G10L 11/06*** | (2006.01) |
| ***G10L 19/08*** | (2006.01) |
| ***G10L 19/14*** | (2006.01) |
| ***H04L 1/00*** | (2006.01) |
| ***H03M 13/00*** | (2006.01) |

(52) U.S. Cl. ........................ 704/207; 704/208; 704/219; 704/221; 704/225; 714/746; 714/747

(58) Field of Classification Search ................. 704/206, 704/207, 208, 212, 214, 219, 221, 225; 714/746, 714/747

See application file for complete search history.

(56) References Cited

U.S. PATENT DOCUMENTS 4,707,857 A * 11/1987 Marley et al. ............... 704/243

(Continued)

FOREIGN PATENT DOCUMENTS

EP 0 747 883 A2 12/1996

(Continued)

OTHER PUBLICATIONS

Johnston, James D., "Transform Coding of Audio Signals Using Perceptual Noise Criteria", *IEEE Journal on Selected Areas in Communications*, 6(2):314-323 (1998).

(Continued)

*Primary Examiner*—Martin Lerner
(74) *Attorney, Agent, or Firm*—K&L Gates LLP

(57) ABSTRACT

The present invention relates to a method and device for improving concealment of frame erasure caused by frames of an encoded sound signal erased during transmission from an encoder (106) to a decoder (110), and for accelerating recovery of the decoder after non erased frames of the encoded sound signal have been received. For that purpose, concealment/recovery parameters are determined in the encoder or decoder. When determined in the encoder (106), the concealment/recovery parameters are transmitted to the decoder (110). In the decoder, erasure frame concealment and decoder recovery is conducted in response to the concealment/recovery parameters. The concealment/recovery parameters may be selected from the group consisting of: a signal classification parameter, an energy information parameter and a phase information parameter. The determination of the concealment/recovery parameters comprises classifying the successive frames of the encoded sound signal as unvoiced, unvoiced transition, voiced transition, voiced, or onset, and this classification is determined on the basis of at least a part of the following parameters: a normalized correlation parameter, a spectral tilt parameter, a signal-to-noise ratio parameter, a pitch stability parameter, a relative frame energy parameter, and a zero crossing parameter.

25 Claims, 7 Drawing Sheets

U.S. PATENT DOCUMENTS

| | | | | |
|---|---|---|---|---|
| 5,122,875 | A | 6/1992 | Raychaudhuri et al. | |
| 5,444,816 | A | 8/1995 | Adoul et al. | |
| 5,651,092 | A * | 7/1997 | Ishii et al. | 704/226 |
| 5,664,055 | A * | 9/1997 | Kroon | 704/223 |
| 5,699,482 | A | 12/1997 | Adoul et al. | |
| 5,699,485 | A * | 12/1997 | Shoham | 704/223 |
| 5,701,390 | A * | 12/1997 | Griffin et al. | 704/206 |
| 5,701,392 | A | 12/1997 | Adoul et al. | |
| 5,732,389 | A | 3/1998 | Kroon et al. | |
| 5,754,976 | A | 5/1998 | Adoul et al. | |
| 5,864,798 | A * | 1/1999 | Miseki et al. | 704/225 |
| 6,138,093 | A * | 10/2000 | Ekudden et al. | 704/228 |
| 6,233,550 | B1 * | 5/2001 | Gersho et al. | 704/208 |
| 6,418,408 | B1 * | 7/2002 | Bhaskar et al. | 704/219 |
| 6,470,308 | B1 * | 10/2002 | Ma et al. | 704/201 |
| 6,475,245 | B2 * | 11/2002 | Gersho et al. | 704/208 |
| 6,614,370 | B2 * | 9/2003 | Gottesman | 341/94 |
| 6,687,667 | B1 * | 2/2004 | Gournay et al. | 704/222 |
| 6,757,654 | B1 * | 6/2004 | Westerlund et al. | 704/262 |
| 6,795,805 | B1 * | 9/2004 | Bessette et al. | 704/223 |
| 6,889,182 | B2 * | 5/2005 | Gustafsson | 704/205 |
| 6,931,373 | B1 * | 8/2005 | Bhaskar et al. | 704/230 |
| 6,937,978 | B2 * | 8/2005 | Liu | 704/228 |
| 7,009,935 | B2 * | 3/2006 | Abrahamsson et al. | 370/228 |
| 7,013,269 | B1 * | 3/2006 | Bhaskar et al. | 704/219 |
| 7,016,833 | B2 * | 3/2006 | Gable et al. | 704/209 |
| 7,031,926 | B2 * | 4/2006 | Makinen et al. | 704/500 |
| 7,039,584 | B2 * | 5/2006 | Gournay et al. | 704/221 |
| 7,047,187 | B2 * | 5/2006 | Cheng et al. | 704/219 |
| 7,149,683 | B2 * | 12/2006 | Jelinek | 704/208 |
| 7,272,556 | B1 * | 9/2007 | Aguilar et al. | 704/230 |
| 7,502,734 | B2 * | 3/2009 | Jelinek | 704/214 |
| 2002/0123887 | A1 * | 9/2002 | Unno | 704/220 |
| 2007/0174047 | A1 * | 7/2007 | Anderson et al. | 704/207 |

FOREIGN PATENT DOCUMENTS

| | | |
|---|---|---|
| EP | 0747883 | 7/2001 |
| RU | 2128405 | 3/1999 |
| RU | 2000102555 | 1/2002 |
| WO | 92/10830 | 6/1992 |
| WO | 00/25305 | 5/2000 |
| WO | 01/06491 | 1/2001 |
| WO | WO 01/86637 | 11/2001 |
| WO | WO 01/86637 A1 | 11/2001 |

OTHER PUBLICATIONS

3rd Generation Partnership Project, "3rd Generation Partnership Project; Technical Specification Group Services and System Aspects; Speech Codec speech processing functions; AMR Wideband Speech Codec; Comfort noise aspects (Release 5)", *3GPP TS 26.192 Technical Specification*, pp. 1-13 (2000).

International Telecommunications Union, "Wideband coding of speech at around 16 kbit/s using Adaptive Multi-Rate Wideband (AMR-WB)", *ITU-T Recommendation G.722.2*, pp. 1-64 (2003).

3rd Generation Partnership Project, "3rd Generation Partnership Project; Technical Specification Group Services and System Aspects; Speech Codec speech processing functions; Adaptive Multi-Rate—Wideband (AMR-WB) Speech Codec; Transcoding functions (Release 6)", *3GPP TS 26.190 Technical Specification*, pp. 1-13 (2005).

International Search Report; International Application No. PCT/CA03/00830; mailed on Aug. 25, 2003, 8 pgs.

Wah, B.W. et al., "A Survey of Error-Concealment Schemes for Real-Time Audio and Video Transmissions over the Internet", *IEEE International Symposium on Multimedia Software Engineering*, (Dec. 2000).

* cited by examiner

METHOD AND DEVICE FOR EFFICIENT FRAME ERASURE CONCEALMENT IN LINEAR PREDICTIVE BASED SPEECH CODECS

CROSS-REFERENCE TO RELATED APPLICATIONS

This application is the national phase of International (PCT) Patent Application Serial No. PCT/CA03/00830, filed May 30, 2003, published under PCT Article 21(2) in English, which claims priority to and the benefit of Canadian Patent Application No. 2,388,439, filed May 31, 2002, the disclosures of which are incorporated herein by reference.

FIELD OF THE INVENTION

The present invention relates to a technique for digitally encoding a sound signal, in particular but not exclusively a speech signal, in view of transmitting and/or synthesizing this sound signal. More specifically, the present invention relates to robust encoding and decoding of sound signals to maintain good performance in case of erased frame(s) due, for example, to channel errors in wireless systems or lost packets in voice over packet network applications.

BACKGROUND OF THE INVENTION

The demand for efficient digital narrow- and wideband speech encoding techniques with a good trade-off between the subjective quality and bit rate is increasing in various application areas such as teleconferencing, multimedia, and wireless communications. Until recently, a telephone bandwidth constrained into a range of 200-3400 Hz has mainly been used in speech coding applications. However, wideband speech applications provide increased intelligibility and naturalness in communication compared to the conventional telephone bandwidth. A bandwidth in the range of 50-7000 Hz has been found sufficient for delivering a good quality giving an impression of face-to-face communication. For general audio signals, this bandwidth gives an acceptable subjective quality, but is still lower than the quality of FM radio or CD that operate on ranges of 20-16000 Hz and 20-20000 Hz, respectively.

A speech encoder converts a speech signal into a digital bit stream which is transmitted over a communication channel or stored in a storage medium. The speech signal is digitized, that is, sampled and quantized with usually 16-bits per sample. The speech encoder has the role of representing these digital samples with a smaller number of bits while maintaining a good subjective speech quality. The speech decoder or synthesizer operates on the transmitted or stored bit stream and converts it back to a sound signal.

Code-Excited Linear Prediction (CELP) coding is one of the best available techniques for achieving a good compromise between the subjective quality and bit rate. This encoding technique is a basis of several speech encoding standards both in wireless and wireline applications. In CELP encoding, the sampled speech signal is processed in successive blocks of L samples usually called frames, where L is a predetermined number corresponding typically to 10-30 ms. A linear prediction (LP) filter is computed and transmitted every frame. The computation of the LP filter typically needs a lookahead, a 5-15 ms speech segment from the subsequent frame. The L-sample frame is divided into smaller blocks called subframes. Usually the number of subframes is three or four resulting in 4-10 ms subframes. In each subframe, an excitation signal is usually obtained from two components, the past excitation and the innovative, fixed-codebook excitation. The component formed from the past excitation is often referred to as the adaptive codebook or pitch excitation. The parameters characterizing the excitation signal are coded and transmitted to the decoder, where the reconstructed excitation signal is used as the input of the LP filter.

As the main applications of low bit rate speech encoding are wireless mobile communication systems and voice over packet networks, then increasing the robustness of speech codecs in case of frame erasures becomes of significant importance. In wireless cellular systems, the energy of the received signal can exhibit frequent severe fades resulting in high bit error rates and this becomes more evident at the cell boundaries. In this case the channel decoder fails to correct the errors in the received frame and as a consequence, the error detector usually used after the channel decoder will declare the frame as erased. In voice over packet network applications, the speech signal is packetized where usually a 20 ms frame is placed in each packet. In packet-switched communications, a packet dropping can occur at a router if the number of packets become very large, or the packet can reach the receiver after a long delay and it should be declared as lost if its delay is more than the length of a jitter buffer at the receiver side. In these systems, the codec is subjected to typically 3 to 5% frame erasure rates. Furthermore, the use of wideband speech encoding is an important asset to these systems in order to allow them to compete with traditional PSTN (public switched telephone network) that uses the legacy narrow band speech signals.

The adaptive codebook, or the pitch predictor, in CELP plays an important role in maintaining high speech quality at low bit rates. However, since the content of the adaptive codebook is based on the signal from past frames, this makes the codec model sensitive to frame loss. In case of erased or lost frames, the content of the adaptive codebook at the decoder becomes different from its content at the encoder. Thus, after a lost frame is concealed and consequent good frames are received, the synthesized signal in the received good frames is different from the intended synthesis signal since the adaptive codebook contribution has been changed. The impact of a lost frame depends on the nature of the speech segment in which the erasure occurred. If the erasure occurs in a stationary segment of the signal then an efficient frame erasure concealment can be performed and the impact on consequent good frames can be minimized. On the other hand, if the erasure occurs in an speech onset or a transition, the effect of the erasure can propagate through several frames. For instance, if the beginning of a voiced segment is lost, then the first pitch period will be missing from the adaptive codebook content. This will have a severe effect on the pitch predictor in consequent good frames, resulting in long time before the synthesis signal converge to the intended one at the encoder.

SUMMARY OF THE INVENTION

The present invention relates to a method for improving concealment of frame erasure caused by frames of an encoded sound signal erased during transmission from an encoder to a decoder, and for accelerating recovery of the decoder after non erased frames of the encoded sound signal have been received, comprising:

determining, in the encoder, concealment/recovery parameters;

transmitting to the decoder the concealment/recovery parameters determined in the encoder; and in the decoder, conducting erasure frame concealment and decoder recovery in response to the received concealment/recovery parameters.

The present invention also relates to a method for the concealment of frame erasure caused by frames erased during transmission of a sound signal encoded under the form of signal-encoding parameters from an encoder to a decoder, and for accelerating recovery of the decoder after non erased frames of the encoded sound signal have been received, comprising:

determining, in the decoder, concealment/recovery parameters from the signal-encoding parameters;

in the decoder, conducting erased frame concealment and decoder recovery in response to the determined concealment/recovery parameters.

In accordance with the present invention, there is also provided a device for improving concealment of frame erasure caused by frames of an encoded sound signal erased during transmission from an encoder to a decoder, and for accelerating recovery of the decoder after non erased frames of the encoded sound signal have been received, comprising:

means for determining, in the encoder, concealment/recovery parameters;

means for transmitting to the decoder the concealment/recovery parameters determined in the encoder; and in the decoder, means for conducting erasure frame concealment and decoder recovery in response to the received concealment/recovery parameters.

According to the invention, there is further provided a device for the concealment of frame erasure caused by frames erased during transmission of a sound signal encoded under the form of signal-encoding parameters from an encoder to a decoder, and for accelerating recovery of the decoder after non erased frames of the encoded sound signal have been received, comprising:

means, for determining, in the decoder, concealment/recovery parameters from the signal-encoding parameters;

in the decoder, means for conducting erased frame concealment and decoder recovery in response to the determined concealment/recovery parameters.

The present invention is also concerned with a system for encoding and decoding a sound signal, and a sound signal decoder using the above defined devices for improving concealment of frame erasure caused by frames of the encoded sound signal erased during transmission from the encoder to the decoder, and for accelerating recovery of the decoder after non erased frames of the encoded sound signal have been received.

The foregoing and other objects, advantages and features of the present invention will become more apparent upon reading of the following non restrictive description of illustrative embodiments thereof, given by way of example only with reference to the accompanying drawings.

DETAILED DESCRIPTION OF THE ILLUSTRATIVE EMBODIMENTS

Although the illustrative embodiments of the present invention will be described in the following description in relation to a speech signal, it should be kept in mind that the concepts of the present invention equally apply to other types of signal, in particular but not exclusively to other types of sound signals.

Figure 1:
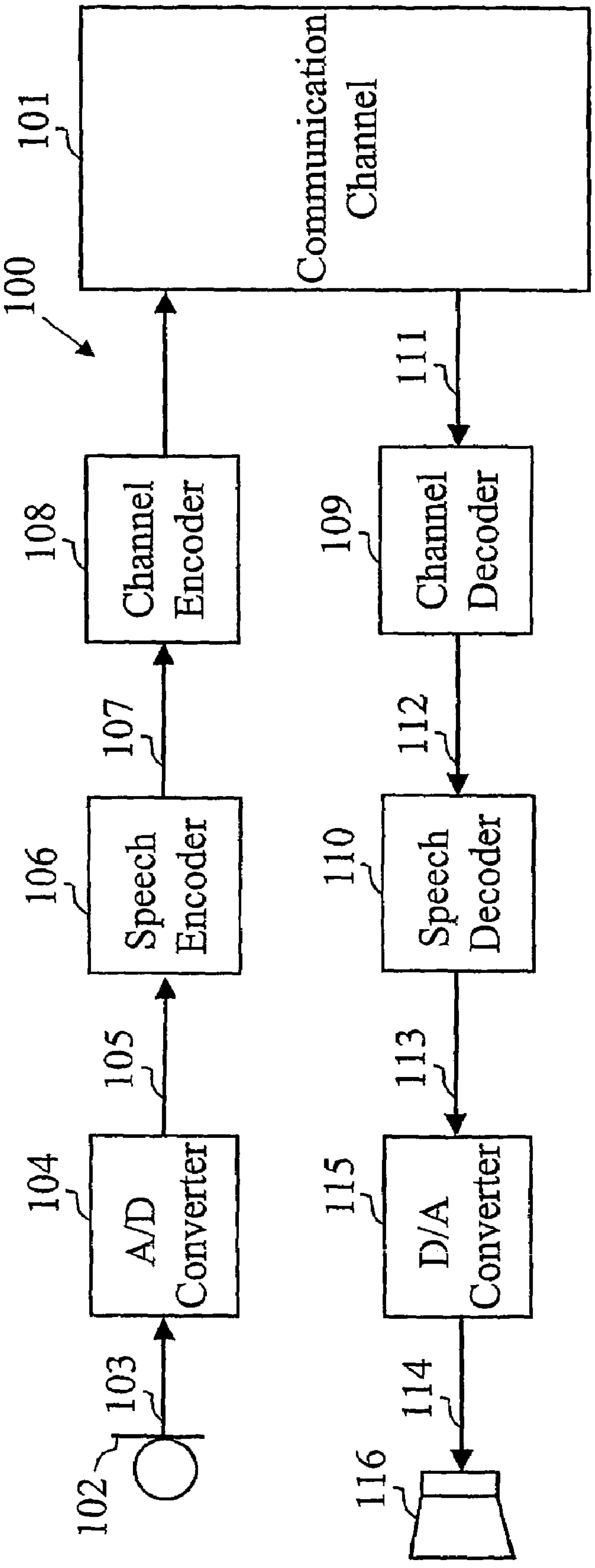
FIG. 1 is a schematic block diagram of a speech communication system illustrating an application of speech encoding and decoding devices in accordance with the present invention.

FIG. 1 illustrates a speech communication system 100 depicting the use of speech encoding and decoding in the context of the present invention. The speech communication system 100 of FIG. 1 supports transmission of a speech signal across a communication channel 101. Although it may comprise for example a wire, an optical link or a fiber link, the communication channel 101 typically comprises at least in part a radio frequency link. The radio frequency link often supports multiple, simultaneous speech communications requiring shared bandwidth resources such as may be found with cellular telephony systems. Although not shown, the communication channel 101 may be replaced by a storage device in a single device embodiment of the system 100 that records and stores the encoded speech signal for later playback.

In the speech communication system 100 of FIG. 1, a microphone 102 produces an analog speech signal 103 that is supplied to an analog-to-digital (A/D) converter 104 for converting it into a digital speech signal 105. A speech encoder 106 encodes the digital speech signal 105 to produce a set of signal-encoding parameters 107 that are coded into binary form and delivered to a channel encoder 108. The optional channel encoder 108 adds redundancy to the binary representation of the signal-encoding parameters 107 before transmitting them over the communication channel 101.

In the receiver, a channel decoder 109 utilizes the said redundant information in the received bit stream 111 to detect and correct channel errors that occurred during the transmission. A speech decoder 110 converts the bit stream 112 received from the channel decoder 109 back to a set of signal-encoding parameters and creates from the recovered signal-encoding parameters a digital synthesized speech signal 113. The digital synthesized speech signal 113 reconstructed at the speech decoder 110 is converted to an analog form 114 by a digital-to-analog (D/A) converter 115 and played back through a loudspeaker unit 116.

The illustrative embodiment of efficient frame erasure concealment method disclosed in the present specification can be used with either narrowband or wideband linear prediction based codecs. The present illustrative embodiment is disclosed in relation to a wideband speech codec that has been standardized by the International Telecommunications Union (ITU) as Recommendation G.722.2 and known as the AMR- WB codec (Adaptive Multi-Rate Wideband codec) [ITU-T Recommendation G.722.2 "Wideband coding of speech at around 16 kbit/s using Adaptive Multi-Rate Wideband (AMR-WB)", Geneva, 2002]. This codec has also been selected by the third generation partnership project (3GPP) for wideband telephony in third generation wireless systems [3GPP TS 26.190, "AMR Wideband Speech Codec: Transcoding Functions," 3GPP Technical Specification]. AMR-WB can operate at 9 bit rates ranging from 6.6 to 23.85 kbit/s. The bit rate of 12.65 kbit/s is used to illustrate the present invention.

Here, it should be understood that the illustrative embodiment of efficient frame erasure concealment method could be applied to other types of codecs.

In the following sections, an overview of the AMR-WB encoder and decoder will be first given. Then, the illustrative embodiment of the novel approach to improve the robustness of the codec will be disclosed.

Overview of the AMR-WB Encoder

Figure 2:
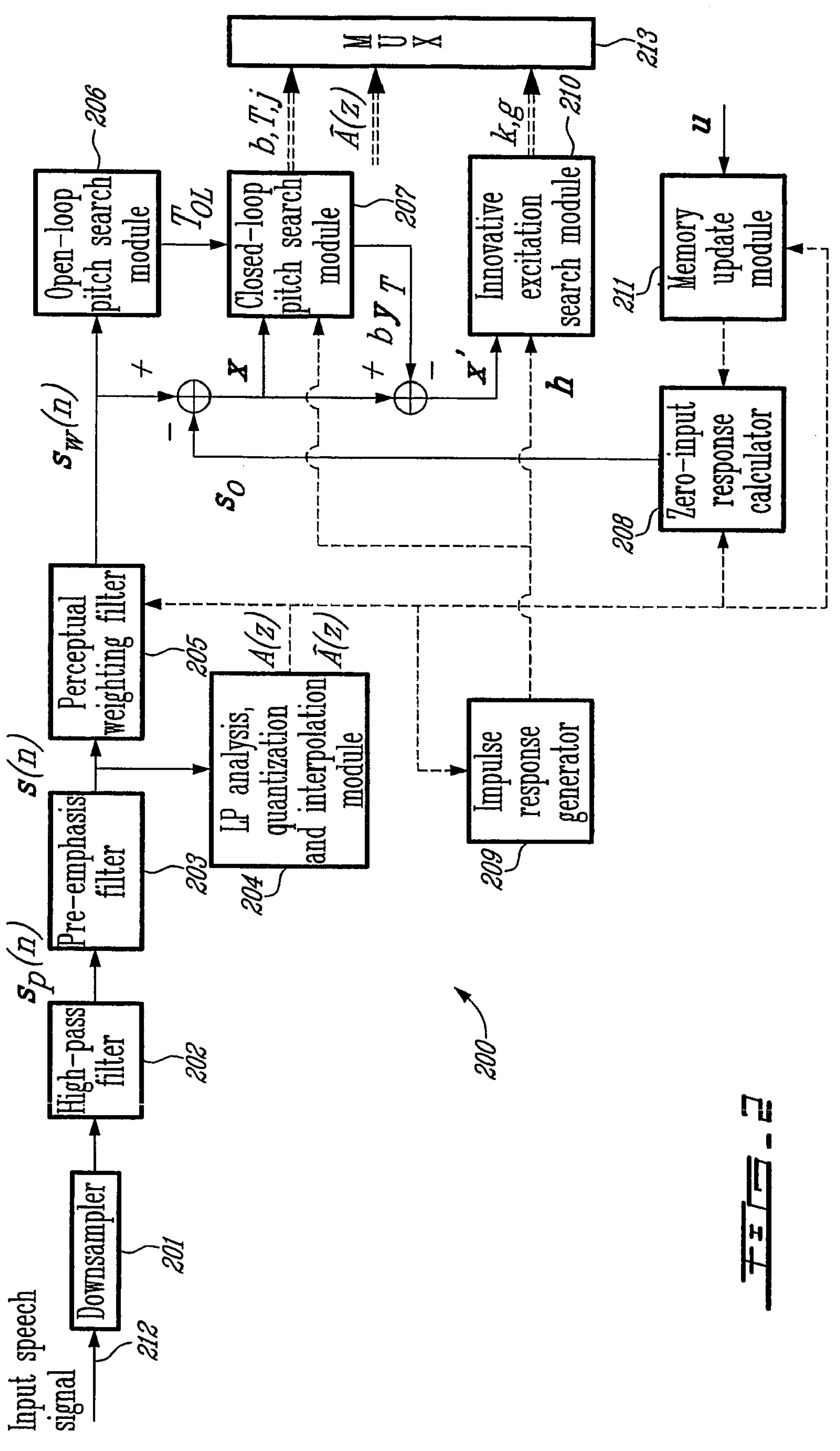
FIG. 2 is a schematic block diagram of an example of wideband encoding device (AMR-WB encoder)

The sampled speech signal is encoded on a block by block basis by the encoding device 200 of FIG. 2 which is broken down into eleven modules numbered from 201 to 211.

The input speech signal 212 is therefore processed on a block-by-block basis, i.e. in the above-mentioned L-sample blocks called frames.

Referring to FIG. 2, the sampled input speech signal 212 is down-sampled in a down-sampler module 201. The signal is down-sampled from 16 kHz down to 12.8 kHz, using techniques well known to those of ordinary skilled in the art. Down-sampling increases the coding efficiency, since a smaller frequency bandwidth is encoded. This also reduces the algorithmic complexity since the number of samples in a frame is decreased. After down-sampling, the 320-sample frame of 20 ms is reduced to a 256-sample frame (down-sampling ratio of 4/5).

The input frame is then supplied to the optional pre-processing module 202. Pre-processing module 202 may consist of a high-pass filter with a 50 Hz cut-off frequency. High-pass filter 202 removes the unwanted sound components below 50 Hz.

The down-sampled, pre-processed signal is denoted by $s_p(n)$, n=0, 1, 2, . . . , L−1, where L is the length of the frame (256 at a sampling frequency of 12.8 kHz). In an illustrative embodiment of the preemphasis filter 203, the signal $s_p(n)$ is preemphasized using a filter having the following transfer function:

$$P(z)=1-\mu z^{-1}$$

where μ is a preemphasis factor with a value located between 0 and 1 (a typical value is μ=0.7). The function of the preemphasis filter 203 is to enhance the high frequency contents of the input speech signal. It also reduces the dynamic range of the input speech signal, which renders it more suitable for fixed-point implementation. Preemphasis also plays an important role in achieving a proper overall perceptual weighting of the quantization error, which contributes to improved sound quality. This will be explained in more detail herein below.

The output of the preemphasis filter 203 is denoted s(n). This signal is used for performing LP analysis in module 204. LP analysis is a technique well known to those of ordinary skill in the art. In this illustrative implementation, the autocorrelation approach is used. In the autocorrelation approach, the signal s(n) is first windowed using, typically, a Hamming window having a length of the order of 30-40 ms. The autocorrelations are computed from the windowed signal, and Levinson-Durbin recursion is used to compute LP filter coefficients, $a_i$, where i=1, . . . , p, and where p is the LP order, which is typically 16 in wideband coding. The parameters $a_i$ are the coefficients of the transfer function A(z) of the LP filter, which is given by the following relation:

$$A(z) = 1 + \sum_{i=1}^{p} a_i z^{-i}$$

LP analysis is performed in module 204, which also performs the quantization and interpolation of the LP filter coefficients. The LP filter coefficients are first transformed into another equivalent domain more suitable for quantization and interpolation purposes. The line spectral pair (LSP) and immitance spectral pair (ISP) domains are two domains in which quantization and interpolation can be efficiently performed. The 16 LP filter coefficients, $a_i$, can be quantized in the order of 30 to 50 bits using split or multi-stage quantization, or a combination thereof. The purpose of the interpolation is to enable updating the LP filter coefficients every subframe while transmitting them once every frame, which improves the encoder performance without increasing the bit rate. Quantization and interpolation of the LP filter coefficients is believed to be otherwise well known to those of ordinary skill in the art and, accordingly, will not be further described in the present specification.

The following paragraphs will describe the rest of the coding operations performed on a subframe basis. In this illustrative implementation, the input frame is divided into 4 subframes of 5 ms (64 samples at the sampling frequency of 12.8 kHz). In the following description, the filter A(z) denotes the unquantized interpolated LP filter of the subframe, and the filter $\hat{A}(z)$ denotes the quantized interpolated LP filter of the subframe. The filter $\hat{A}(z)$ is supplied every subframe to a multiplexer 213 for transmission through a communication channel.

In analysis-by-synthesis encoders, the optimum pitch and innovation parameters are searched by minimizing the mean squared error between the input speech signal 212 and a synthesized speech signal in a perceptually weighted domain. The weighted signal $s_w(n)$ is computed in a perceptual weighting filter 205 in response to the signal s(n) from the pre-emphasis filter 203. A perceptual weighting filter 205 with fixed denominator, suited for wideband signals, is used. An example of transfer function for the perceptual weighting filter 205 is given by the following relation:

$$W(z)=A(z/y_1)/(1-y_2 z^{-1}) \text{ where } 0<y_2<y_1\leqq 1$$

In order to simplify the pitch analysis, an open-loop pitch lag $T_{OL}$ is first estimated in an open-loop pitch search module 206 from the weighted speech signal $s_w(n)$. Then the closed-loop pitch analysis, which is performed in a closed-loop pitch search module 207 on a subframe basis, is restricted around the open-loop pitch lag $T_{OL}$ which significantly reduces the search complexity of the LTP parameters T (pitch lag) and b (pitch gain) The open-loop pitch analysis is usually performed in module 206 once every 10 ms (two subframes) using techniques well known to those of ordinary skill in the art.

The target vector x for LTP (Long Term Prediction) analysis is first computed. This is usually done by subtracting the zero-input response $s_0$ of weighted synthesis filter $W(z)/\hat{A}(z)$ from the weighted speech signal $s_w(n)$. This zero-input response $s_0$ is calculated by a zero-input response calculator 208 in response to the quantized interpolation LP filter $\hat{A}(z)$ from the LP analysis, quantization and interpolation module 204 and to the initial states of the weighted synthesis filter $W(z)\hat{A}(z)$ stored in memory update module 211 in response to the LP filters $A(z)$ and $\hat{A}(z)$, and the excitation vector u. This operation is well known to those of ordinary skill in the art and, accordingly, will not be further described.

A N-dimensional impulse response vector h of the weighted synthesis filter $W(z)/\hat{A}(z)$ is computed in the impulse response generator 209 using the coefficients of the LP filter $A(z)$ and $\hat{A}(z)$ from module 204. Again, this operation is well known to those of ordinary skill in the art and, accordingly, will not be further described in the present specification.

The closed-loop pitch (or pitch codebook) parameters b, T and j are computed in the closed-loop pitch search module 207, which uses the target vector x, the impulse response vector h and the open-loop pitch lag $T_{OL}$ as inputs.

The pitch search consists of finding the best pitch lag T and gain b that minimize a mean squared weighted pitch prediction error, for example $$e^{(j)}=\|x-b^{(j)}y^{(j)}\|^2 \text{ where } j=1, 2, \ldots, k$$

between the target vector x and a scaled filtered version of the past excitation.

More specifically, in the present illustrative implementation, the pitch (pitch codebook) search is composed of three stages.

In the first stage, an open-loop pitch lag $T_{OL}$ is estimated in the open-loop pitch search module 206 in response to the weighted speech signal $s_w(n)$. As indicated in the foregoing description, this open-loop pitch analysis is usually performed once every 10 ms (two subframes) using techniques well known to those of ordinary skill in the art.

In the second stage, a search criterion C is searched in the closed-loop pitch search module 207 for integer pitch lags around the estimated open-loop pitch lag $T_{OL}$ (usually ±5), which significantly simplifies the search procedure. A simple procedure is used for updating the filtered codevector $y_T$ (this vector is defined in the following description) without the need to compute the convolution for every pitch lag. An example of search criterion C is given by:

$$C = \frac{x^t y_T}{\sqrt{y_T^t y_T}}$$

where t denotes vector transpose

Once an optimum integer pitch lag is found in the second stage, a third stage of the search (module 207) tests, by means of the search criterion C, the fractions around that optimum integer pitch lag. For example, the AMR-WB standard uses ¼ and ½ subsample resolution.

In wideband signals, the harmonic structure exists only up to a certain frequency, depending on the speech segment. Thus, in order to achieve efficient representation of the pitch contribution in voiced segments of a wideband speech signal, flexibility is needed to vary the amount of periodicity over the wideband spectrum. This is achieved by processing the pitch codevector through a plurality of frequency shaping filters (for example low-pass or band-pass filters). And the frequency shaping filter that minimizes the mean-squared weighted error $e^{(j)}$ is selected. The selected frequency shaping filter is identified by an index j.

The pitch codebook index T is encoded and transmitted to the multiplexer 213 for transmission through a communication channel. The pitch gain b is quantized and transmitted to the multiplexer 213. An extra bit is used to encode the index j, this extra bit being also supplied to the multiplexer 213.

Once the pitch, or LTP (Long Term Prediction) parameters b, T, and j are determined, the next step is to search for the optimum innovative excitation by means of the innovative excitation search module 210 of FIG. 2. First, the target vector x is updated by subtracting the LTP contribution:

$$x'=x-by_T$$

where b is the pitch gain and $y_T$ is the filtered pitch codebook vector (the past excitation at delay T filtered with the selected frequency shaping filter (index j) filter and convolved with the impulse response h).

The innovative excitation search procedure in CELP is performed in an innovation codebook to find the optimum excitation codevector $c_k$ and gain g which minimize the mean-squared error E between the target vector x' and a scaled filtered version of the codevector $c_k$, for example:

$$E=\lambda x'-gHc_k\|^2$$

where H is a lower triangular convolution matrix derived from the impulse response vector h. The index k of the innovation codebook corresponding to the found optimum codevector $c_k$ and the gain g are supplied to the multiplexer 213 for transmission through a communication channel.

It should be noted that the used innovation codebook is a dynamic codebook consisting of an algebraic codebook followed by an adaptive prefilter F(z) which enhances special spectral components in order to improve the synthesis speech quality, according to U.S. Pat. No. 5,444,816 granted to Adoul et al. on Aug. 22, 1995. In this illustrative implementation, the innovative codebook search is performed in module 210 by means of an algebraic codebook as described in U.S. Pat. No. 5,444,816 (Adoul et al.) issued on Aug. 22, 1995; U.S. Pat. No. 5,699,482 granted to Adoul et al., on Dec. 17, 1997; U.S. Pat. No. 5,754,976 granted to Adoul et al., on May 19, 1998; and U.S. Pat. No. 5,701,392 (Adoul et al.) dated Dec. 23, 1997.

Overview of AMR-WB Decoder

Figure 3:
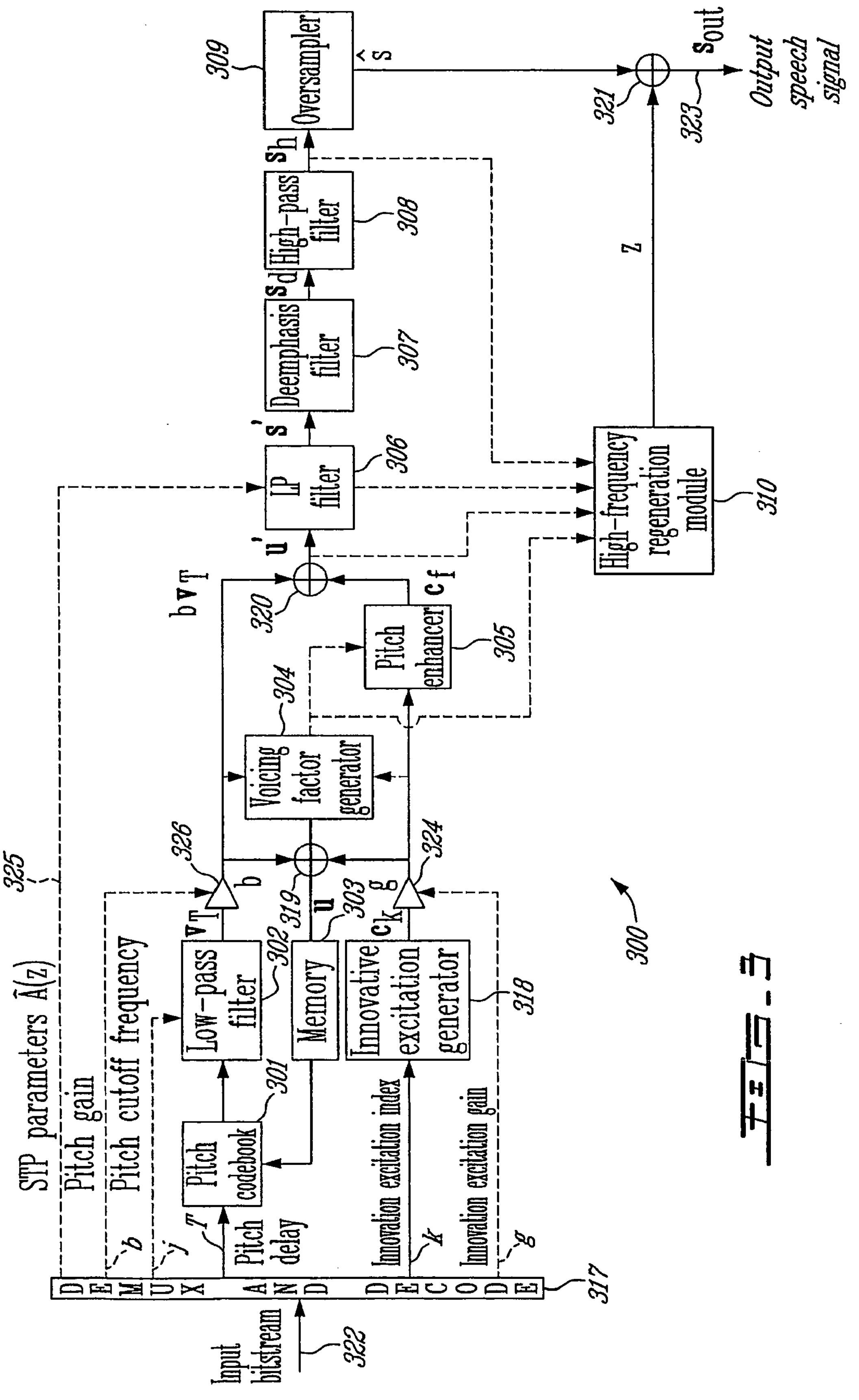
FIG. 3 is a schematic block diagram of an example of wideband decoding device (AMR-WB decoder)

The speech decoder 300 of FIG. 3 illustrates the various steps carried out between the digital input 322 (input bit stream to the demultiplexer 317) and the output sampled speech signal 323 (output of the adder 321).

Demultiplexer 317 extracts the synthesis model parameters from the binary information (input bit stream 322) received from a digital input channel. From each received binary frame, the extracted parameters are:

- the quantized, interpolated LP coefficients $\hat{A}(z)$ also called short-term prediction parameters (STP) produced once per frame;
- the long-term prediction (LTP) parameters T, b, and j (for each subframe); and
- the innovation codebook index k and gain g (for each subframe).

The current speech signal is synthesized based on these parameters as will be explained hereinbelow.

The innovation codebook 318 is responsive to the index k to produce the innovation codevector $c_k$, which is scaled by the decoded gain factor g through an amplifier 324. In the illustrative implementation, an innovation codebook as described in the above mentioned U.S. Pat. Nos. 5,444,816; 5,699,482; 5,754,976; and 5,701,392 is used to produce the innovative codevector $c_k$.

The generated scaled codevector at the output of the amplifier 324 is processed through a frequency-dependent pitch enhancer 305.

Enhancing the periodicity of the excitation signal u improves the quality of voiced segments. The periodicity enhancement is achieved by filtering the innovative codevector $c_k$ from the innovation (fixed) codebook through an innovation filter F(z) (pitch enhancer 305) whose frequency response emphasizes the higher frequencies more than the lower frequencies. The coefficients of the innovation filter F(z) are related to the amount of periodicity in the excitation signal u.

An efficient, illustrative way to derive the coefficients of the innovation filter F(z) is to relate them to the amount of pitch contribution in the total excitation signal u. This results in a frequency response depending on the subframe periodicity, where higher frequencies are more strongly emphasized (stronger overall slope) for higher pitch gains. The innovation filter 305 has the effect of lowering the energy of the innovation codevector $c_k$ at lower frequencies when the excitation signal u is more periodic, which enhances the periodicity of the excitation signal u at lower frequencies more than higher frequencies. A suggested form for the innovation filter 305 is the following:

$$F(z)=-\alpha z+1-\alpha z^{-1}$$

where α is a periodicity factor derived from the level of periodicity of the excitation signal u. The periodicity factor α is computed in the voicing factor generator 304. First, a voicing factor $r_v$ is computed in voicing factor generator 304 by:

$$r_v=(E_v-E_c)/(E_v+E_c)$$

where $E_v$ is the energy of the scaled pitch codevector $bv_T$ and $E_C$ is the energy of the scaled innovative codevector $gc_k$. That is:

$$E_v=b^2v_T^tv_T=b^2\sum_{n=0}^{N-1}v_T^2(n)$$

and $$E_c=g^2c_k^tc_k=g^2\sum_{n=0}^{N-1}c_k^2(n)$$

Note that the value of $r_v$ lies between −1 and 1 (1 corresponds to purely voiced signals and −1 corresponds to purely unvoiced signals).

The above mentioned scaled pitch codevector $bv_T$ is produced by applying the pitch delay T to a pitch codebook 301 to produce a pitch codevector. The pitch codevector is then processed through a low-pass filter 302 whose cut-off frequency is selected in relation to index j from the demultiplexer 317 to produce the filtered pitch codevector $v_T$. Then, the filtered pitch codevector $v_T$ is then amplified by the pitch gain b by an amplifier 326 to produce the scaled pitch codevector $bv_T$.

In this illustrative implementation, the factor α is then computed in voicing factor generator 304 by:

$$\alpha=0.125(1+r_V)$$

which corresponds to a value of 0 for purely unvoiced signals and 0.25 for purely voiced signals.

The enhanced signal $c_f$ is therefore computed by filtering the scaled innovative codevector $gc_k$ through the innovation filter 305 (F(z)).

The enhanced excitation signal u' is computed by the adder 320 as:

$$u'=c_f+bv_T$$

It should be noted that this process is not performed at the encoder 200. Thus, it is essential to update the content of the pitch codebook 301 using the past value of the excitation signal u without enhancement stored in memory 303 to keep synchronism between the encoder 200 and decoder 300. Therefore, the excitation signal u is used to update the memory 303 of the pitch codebook 301 and the enhanced excitation signal u' is used at the input of the LP synthesis filter 306.

The synthesized signal s' is computed by filtering the enhanced excitation signal u' through the LP synthesis filter 306 which has the form $1/\hat{A}(z)$, where $\hat{A}(z)$ is the quantized, interpolated LP filter in the current subframe. As can be seen in FIG. 3, the quantized, interpolated LP coefficients $\hat{A}(z)$ on line 325 from the demultiplexer 317 are supplied to the LP synthesis filter 306 to adjust the parameters of the LP synthesis filter 306 accordingly. The deemphasis filter 307 is the inverse of the preemphasis filter 203 of FIG. 2. The transfer function of the deemphasis filter 307 is given by $$D(z)=1/(1-\mu z^{-1})$$

where μ is a preemphasis factor with a value located between 0 and 0.1 (a typical value is μ=0.7). A higher-order filter could also be used.

The vector s' is filtered through the deemphasis filter D(z) 307 to obtain the vector $s_d$, which is processed through the high-pass filter 308 to remove the unwanted frequencies below 50 Hz and further obtain $s_h$.

The oversampler 309 conducts the inverse process of the downsampler 201 of FIG. 2. In this illustrative embodiment, over-sampling converts the 12.8 kHz sampling rate back to the original 16 kHz sampling rate, using techniques well known to those of ordinary skill in the art. The oversampled synthesis signal is denoted $\hat{s}$. Signal $\hat{s}$ is also referred to as the synthesized wideband intermediate signal.

The oversampled synthesis signal $\hat{s}$ does not contain the higher frequency components which were lost during the downsampling process (module 201 of FIG. 2) at the encoder 200. This gives a low-pass perception to the synthesized speech signal. To restore the full band of the original signal, a high frequency generation procedure is performed in module 310 and requires input from voicing factor generator 304 (FIG. 3).

The resulting band-pass filtered noise sequence z from the high frequency generation module 310 is added by the adder 321 to the oversampled synthesized speech signal $\hat{s}$ to obtain the final reconstructed output speech signal $s_{out}$ on the output 323. An example of high frequency regeneration process is described in International PCT patent application published under No. WO 00/25305 on May 4, 2000.

The bit allocation of the AMR-WB codec at 12.65 kbit/s is given in Table 1.

TABLE 1

Bit allocation in the 12.65-kbit/s mode

| Parameter | Bits / Frame |
|---|---|
| LP Parameters | 46 |
| Pitch Delay | 30 = 9 + 6 + 9 + 6 |
| Pitch Filtering | 4 = 1 + 1 + 1 + 1 |
| Gains | 28 = 7 + 7 + 7 + 7 |
| Algebraic Codebook | 144 = 36 + 36 + 36 + 36 |
| Mode Bit | 1 |
| Total | 253 bits = 12.65 kbit/s |

Robust Frame Erasure Concealment

The erasure of frames has a major effect on the synthesized speech quality in digital speech communication systems, especially when operating in wireless environments and packet-switched networks. In wireless cellular systems, the energy of the received signal can exhibit frequent severe fades resulting in high bit error rates and this becomes more evident at the cell boundaries. In this case the channel decoder fails to correct the errors in the received frame and as a consequence, the error detector usually used after the channel decoder will declare the frame as erased. In voice over packet network applications, such as Voice over Internet Protocol (VoIP), the speech signal is packetized where usually a 20 ms frame is placed in each packet. In packet-switched communications, a packet dropping can occur at a router if the number of packets becomes very large, or the packet can arrive at the receiver after a long delay and it should be declared as lost if its delay is more than the length of a jitter buffer at the receiver side. In these systems, the codec is subjected to typically 3 to 5% frame erasure rates.

The problem of frame erasure (FER) processing is basically twofold. First, when an erased frame indicator arrives, the missing frame must be generated by using the information sent in the previous frame and by estimating the signal evolution in the missing frame. The success of the estimation depends not only on the concealment strategy, but also on the place in the speech signal where the erasure happens. Secondly, a smooth transition must be assured when normal operation recovers, i.e. when the first good frame arrives after a block of erased frames (one or more). This is not a trivial task as the true synthesis and the estimated synthesis can evolve differently. When the first good frame arrives, the decoder is hence desynchronized from the encoder. The main reason is that low bit rate encoders rely on pitch prediction, and during erased frames, the memory of the pitch predictor is no longer the same as the one at the encoder. The problem is amplified when many consecutive frames are erased. As for the concealment, the difficulty of the normal processing recovery depends on the type of speech signal where the erasure occurred.

The negative effect of frame erasures can be significantly reduced by adapting the concealment and the recovery of normal processing (further recovery) to the type of the speech signal where the erasure occurs. For this purpose, it is necessary to classify each speech frame. This classification can be done at the encoder and transmitted. Alternatively, it can be estimated at the decoder.

For the best concealment and recovery, there are few critical characteristics of the speech signal that must be carefully controlled. These critical characteristics are the signal energy or the amplitude, the amount of periodicity, the spectral envelope and the pitch period. In case of a voiced speech recovery, further improvement can be achieved by a phase control. With a slight increase in the bit rate, few supplementary parameters can be quantized and transmitted for better control. If no additional bandwidth is available, the parameters can be estimated at the decoder. With these parameters controlled, the frame erasure concealment and recovery can be significantly improved, especially by improving the convergence of the decoded signal to the actual signal at the encoder and alleviating the effect of mismatch between the encoder and decoder when normal processing recovers.

In the present illustrative embodiment of the present invention, methods for efficient frame erasure concealment, and methods for extracting and transmitting parameters that will improve the performance and convergence at the decoder in the frames following an erased frame are disclosed. These parameters include two or more of the following: frame classification, energy, voicing information, and phase information. Further, methods for extracting such parameters at the decoder if transmission of extra bits is not possible, are disclosed. Finally, methods for improving the decoder convergence in good frames following an erased frame are also disclosed.

The frame erasure concealment techniques according to the present illustrative embodiment have been applied to the AMR-WB codec described above. This codec will serve as an example framework for the implementation of the FER concealment methods in the following description. As explained above, the input speech signal 212 to the codec has a 16 kHz sampling frequency, but it is downsampled to a 12.8 kHz sampling frequency before further processing. In the present illustrative embodiment, FER processing is done on the downsampled signal.

Figure 4:
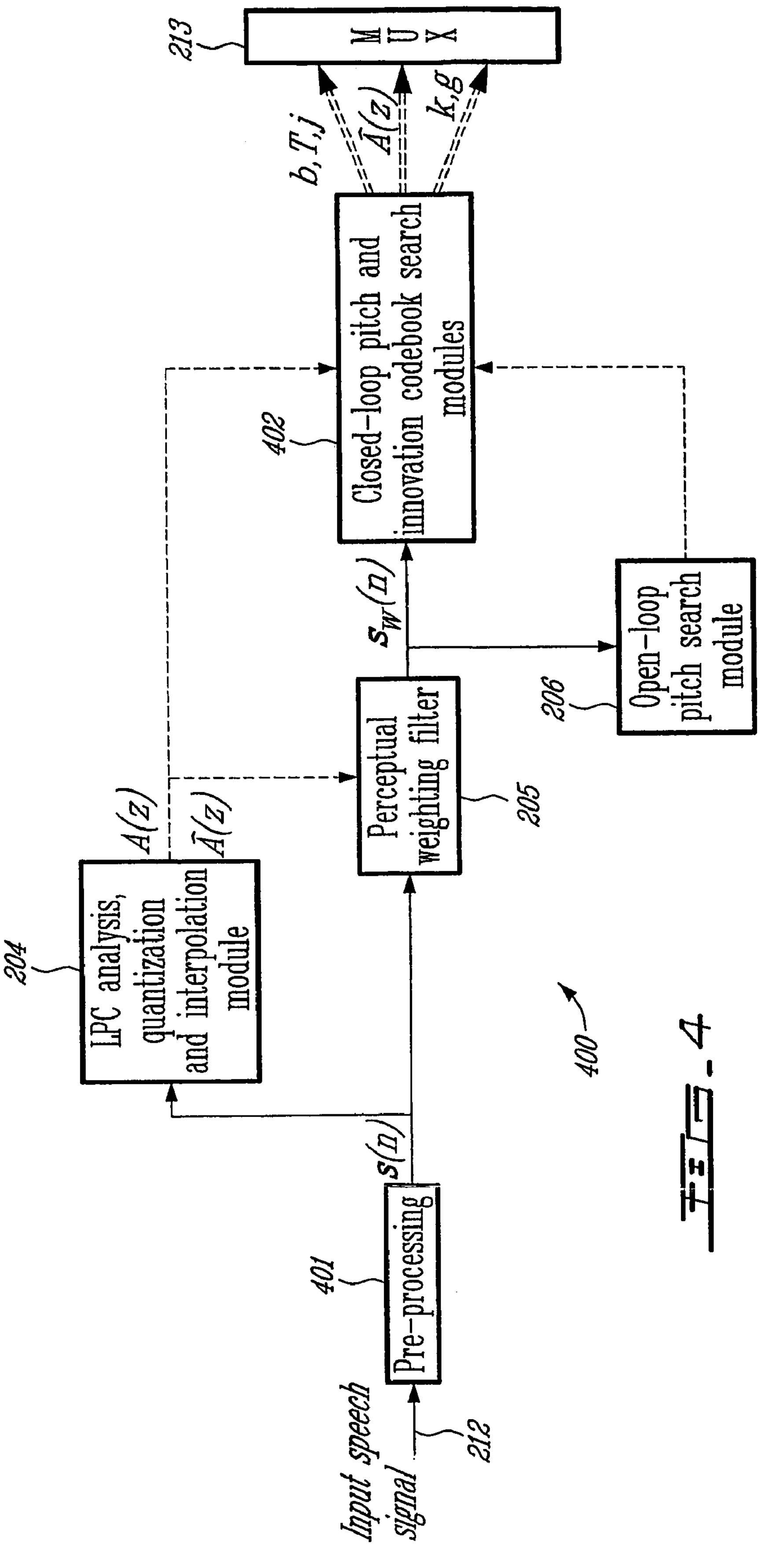
FIG. 4 is a simplified block diagram of the AMR-WB encoder of FIG. 2, wherein the down-sampler module, the high-pass filter module and the pre-emphasis filter module have been grouped in a single pre-processing module, and wherein the closed-loop pitch search module, the zero-input response calculator module, the impulse response generator module, the innovative excitation search module and the memory update module have been grouped in a single closed-loop pitch and innovative codebook search module.

FIG. 4 gives a simplified block diagram of the AMR-WB encoder 400. In this simplified block diagram, the downsampler 201, high-pass filter 202 and preemphasis filter 203 are grouped together in the preprocessing module 401. Also, the closed-loop search module 207, the zero-input response calculator 208, the impulse response calculator 209, the innovative excitation search module 210, and the memory update module 211 are grouped in a closed-loop pitch and innovation codebook search modules 402. This grouping is done to simplify the introduction of the new modules related to the illustrative embodiment of the present invention.

Figure 5:
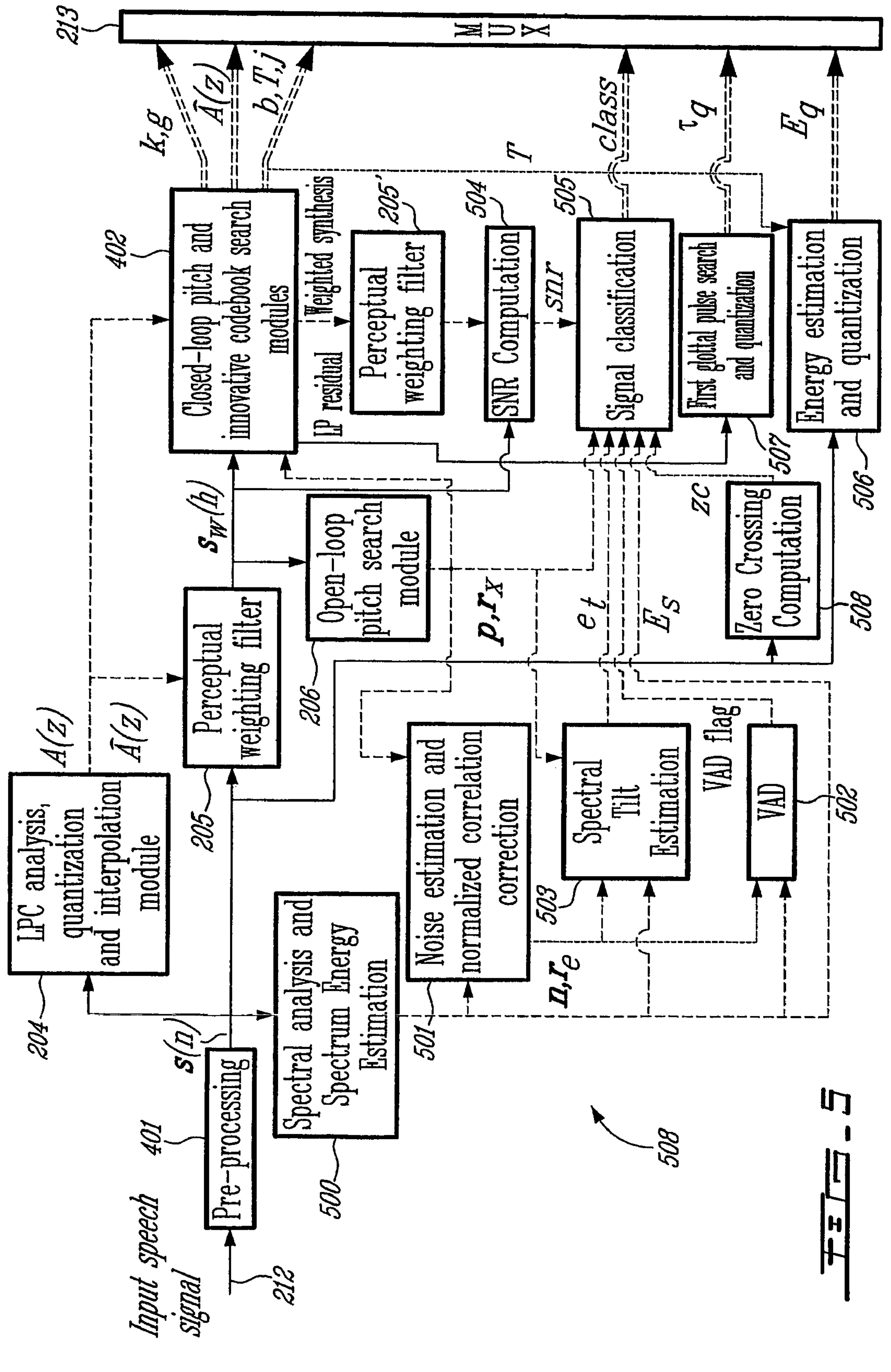
FIG. 5 is an extension of the block diagram of FIG. 4 in which modules related to an illustrative embodiment of the present invention have been added.

FIG. 5 is an extension of the block diagram of FIG. 4 where the modules related to the illustrative embodiment of the present invention are added. In these added modules 500 to 507, additional parameters are computed, quantized, and transmitted with the aim to improve the FER concealment and the convergence and recovery of the decoder after erased frames. In the present illustrative embodiment, these parameters include signal classification, energy, and phase information (the estimated position of the first glottal pulse in a frame).

In the next sections, computation and quantization of these additional parameters will be given in detail and become more apparent with reference to FIG. 5. Among these parameters, signal classification will be treated in more detail. In the subsequent sections, efficient FER concealment using these additional parameters to improve the convergence will be explained.

Signal Classification for FER Concealment and Recovery

The basic idea behind using a classification of the speech for a signal reconstruction in the presence of erased frames consists of the fact that the ideal concealment strategy is different for quasi-stationary speech segments and for speech segments with rapidly changing characteristics. While the best processing of erased frames in non-stationary speech segments can be summarized as a rapid convergence of speech-encoding parameters to the ambient noise characteristics, in the case of quasi-stationary signal, the speech-encoding parameters do not vary dramatically and can be kept practically unchanged during several adjacent erased frames before being damped. Also, the optimal method for a signal recovery following an erased block of frames varies with the classification of the speech signal.

The speech signal can be roughly classified as voiced, unvoiced and pauses. Voiced speech contains an important amount of periodic components and can be further divided in the following categories: voiced onsets, voiced segments, voiced transitions and voiced offsets. A voiced onset is defined as a beginning of a voiced speech segment after a pause or an unvoiced segment. During voiced segments, the speech signal parameters (spectral envelope, pitch period, ratio of periodic and non-periodic components, energy) vary slowly from frame to frame. A voiced transition is characterized by rapid variations of a voiced speech, such as a transition between vowels. Voiced offsets are characterized by a gradual decrease of energy and voicing at the end of voiced segments.

The unvoiced parts of the signal are characterized by missing the periodic component and can be further divided into unstable frames, where the energy and the spectrum changes rapidly, and stable frames where these characteristics remain relatively stable. Remaining frames are classified as silence. Silence frames comprise all frames without active speech, i.e. also noise-only frames if a background noise is present.

Not all of the above mentioned classes need a separate processing. Hence, for the purposes of error concealment techniques, some of the signal classes are grouped together.

Classification at the Encoder

When there is an available bandwidth in the bitstream to include the classification information, the classification can be done at the encoder. This has several advantages. The most important is that there is often a look-ahead in speech encoders. The look-ahead permits to estimate the evolution of the signal in the following frame and consequently the classification can be done by taking into account the future signal behavior. Generally, the longer is the look-ahead, the better can be the classification. A further advantage is a complexity reduction, as most of the signal processing necessary for frame erasure concealment is needed anyway for speech encoding. Finally, there is also the advantage to work with the original signal instead of the synthesized signal.

The frame classification is done with the consideration of the concealment and recovery strategy in mind. In other words, any frame is classified in such a way that the concealment can be optimal if the following frame is missing, or that the recovery can be optimal if the previous frame was lost. Some of the classes used for the FER processing need not be transmitted, as they can be deduced without ambiguity at the decoder. In the present illustrative embodiment, five (5) distinct classes are used, and defined as follows:

UNVOICED class comprises all unvoiced speech frames and all frames without active speech. A voiced offset frame can be also classified as UNVOICED if its end tends to be unvoiced and the concealment designed for unvoiced frames can be used for the following frame in case it is lost.

UNVOICED TRANSITION class comprises unvoiced frames with a possible voiced onset at the end. The onset is however still too short or not built well enough to use the concealment designed for voiced frames. The UNVOICED TRANSITION class can follow only a frame classified as UNVOICED or UNVOICED TRANSITION.

VOICED TRANSITION class comprises voiced frames with relatively weak voiced characteristics. Those are typically voiced frames with rapidly changing characteristics (transitions between vowels) or voiced offsets lasting the whole frame. The VOICED TRANSITION class can follow only a frame classified as VOICED TRANSITION, VOICED or ONSET.

VOICED class comprises voiced frames with stable characteristics. This class can follow only a frame classified as VOICED TRANSITION, VOICED or ONSET.

ONSET class comprises all voiced frames with stable characteristics following a frame classified as UNVOICED or UNVOICED TRANSITION. Frames classified as ONSET correspond to voiced onset frames where the onset is already sufficiently well built for the use of the concealment designed for lost voiced frames. The concealment techniques used for a frame erasure following the ONSET class are the same as following the VOICED class. The difference is in the recovery strategy. If an ONSET class frame is lost (i.e. a VOICED good frame arrives after an erasure, but the last good frame before the erasure was UNVOICED), a special technique can be used to artificially reconstruct the lost onset. This scenario can be seen in FIG. 6. The artificial onset reconstruction techniques will be described in more detail in the following description. On the other hand if an ONSET good frame arrives after an erasure and the last good frame before the erasure was UNVOICED, this special processing is not needed, as the onset has not been lost (has not been in the lost frame).

Figure 7:
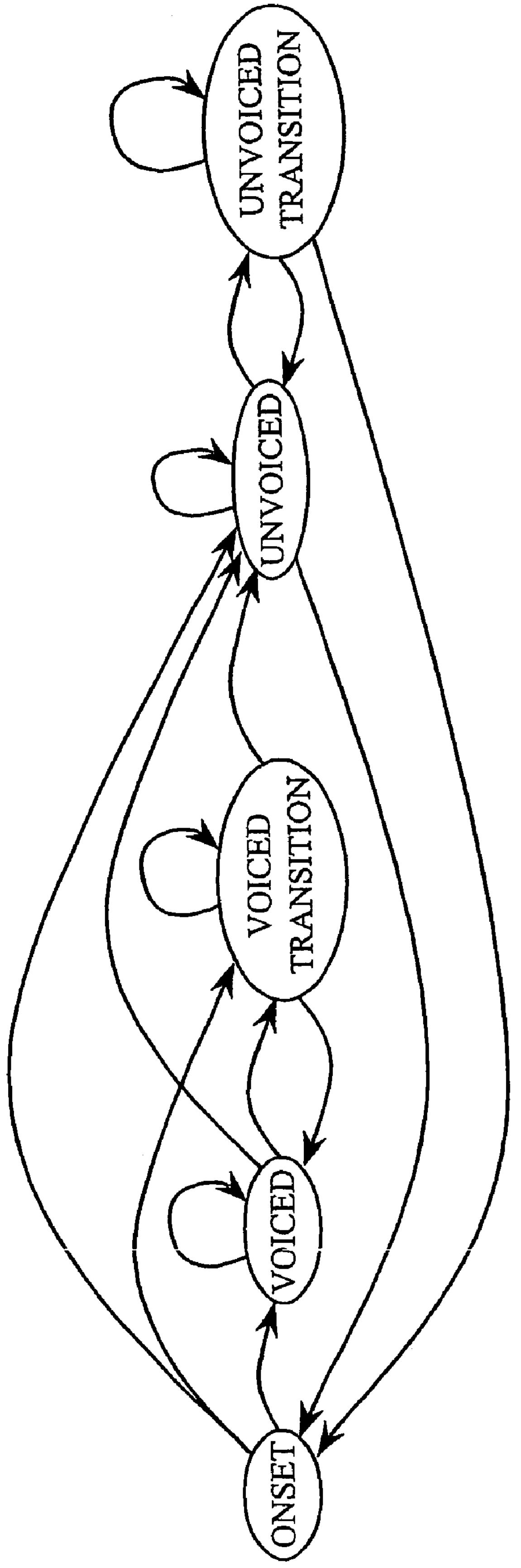
FIG. 7 is a schematic diagram showing an illustrative embodiment of a frame classification state machine for the erasure concealment.

The classification state diagram is outlined in FIG. 7. If the available bandwidth is sufficient, the classification is done in the encoder and transmitted using 2 bits. As it can be seen from FIG. 7, UNVOICED TRANSITION class and VOICED TRANSITION class can be grouped together as they can be unambiguously differentiated at the decoder (UNVOICED TRANSITION can follow only UNVOICED or UNVOICED TRANSITION frames, VOICED TRANSITION can follow only ONSET, VOICED or VOICED TRANSITION frames). The following parameters are used for the classification: a normalized correlation $r_x$, a spectral tilt measure et, a signal to noise ratio snr, a pitch stability counter pc, a relative frame energy of the signal at the end of the current frame $E_s$ and a zero-crossing counter zc. As can be seen in the following detailed analysis, the computation of these parameters uses the available look-ahead as much as possible to take into account the behavior of the speech signal also in the following frame.

The normalized correlation $r_x$ is computed as part of the open-loop pitch search module 206 of FIG. 5. This module 206 usually outputs the open-loop pitch estimate every 10 ms (twice per frame). Here, it is also used to output the normalized correlation measures. These normalized correlations are computed on the current weighted speech signal $s_w(n)$ and the past weighted speech signal at the open-loop pitch delay. In order to reduce the complexity, the weighted speech signal $s_w(n)$ is downsampled by a factor of 2 prior to the open-loop pitch analysis down to the sampling frequency of 6400 Hz [3GPP TS 26.190, "AMR Wideband Speech Codec:

Transcoding Functions," 3GPP Technical Specification]. The average correlation rx is defined as $$\bar{r}_x=0.5(r_x(1)+r_x(2)) \quad (1)$$

where $r_x(1)$, $r_x(2)$ are respectively the normalized correlation of the second half of the current frame and of the look-ahead. In this illustrative embodiment, a look-ahead of 13 ms is used unlike the AMR-WB standard that uses 5 ms. The normalized correlation $r_x(k)$ is computed as follows:

$$r_x(k)=\frac{r_{xy}}{\sqrt{r_{xx},r_{yy}}}, \quad (2)$$

where $$r_{xy}=\sum_{i=0}^{Lk-1} x(t_k+i)\cdot x(t_k+i-p_k)$$

$$r_{xx}=\sum_{i=0}^{Lk-1} x^2(t_k+i)$$

$$r_{yy}=\sum_{i=0}^{Lk-1} x^2(t_k+i-p_k)$$

The correlations $r_x(k)$ are computed using the weighted speech signal $s_w(n)$. The instants $t_k$ are related to the current frame beginning and are equal to 64 and 128 samples respectively at the sampling rate or frequency of 6.4 kHz (10 and 20 ms). The values $p_k=T_{OL}$ are the selected open-loop pitch estimates. The length of the autocorrelation computation $L_k$ is dependant on the pitch period. The values of $L_k$ are summarized below (for the sampling rate of 6.4 kHz):

$L_k$=40 samples for $p_k \leqq 31$ samples $L_k$=62 samples for $p_k \leqq 61$ samples $L_k$=115 samples for $p_k>61$ samples These lengths assure that the correlated vector length comprises at least one pitch period which helps for a robust open-loop pitch detection. For long pitch periods ($p_1>61$ samples), $r_x(1)$ and $r_x(2)$ are identical, i.e. only one correlation is computed since the correlated vectors are long enough so that the analysis on the look-ahead is no longer necessary.

The spectral tilt parameter $e_t$ contains the information about the frequency distribution of energy. In the present illustrative embodiment, the spectral tilt is estimated as a ratio between the energy concentrated in low frequencies and the energy concentrated in high frequencies. However, it can also be estimated in different ways such as a ratio between the two first autocorrelation coefficients of the speech signal.

The discrete Fourier Transform is used to perform the spectral analysis in the spectral analysis and spectrum energy estimation module 500 of FIG. 5. The frequency analysis and the tilt computation are done twice per frame. 256 points Fast Fourier Transform (FFT) is used with a 50 percent overlap. The analysis windows are placed so that all the look ahead is exploited. In this illustrative embodiment, the beginning of the first window is placed 24 samples after the beginning of the current frame. The second window is placed 128 samples further. Different windows can be used to weight the input signal for the frequency analysis. A square root of a Hamming window (which is equivalent to a sine window) has been used in the present illustrative embodiment. This window is particularly well suited for overlap-add methods. Therefore, this particular spectral analysis can be used in an optional noise suppression algorithm based on spectral subtraction and overlap-add analysis/synthesis.

The energy in high frequencies and in low frequencies is computed in module 500 of FIG. 5 following the perceptual critical bands. In the present illustrative embodiment each critical band is considered up to the following number [J. D. Johnston, "Transform Coding of Audio Signals Using Perceptual Noise Criteria," IEEE Jour. on Selected Areas in Communications, vol. 6, no. 2, pp. 314-323]:

Critical bands {100.0, 200.0, 300.0, 400.0, 510.0, 630.0, 770.0, 920.0, 1080.0, 1270.0, 1480.0, 1720.0, 2000.0, 2320.0, 2700.0, 3150.0, 3700.0, 4400.0, 5300.0, 6350.0} Hz.

The energy in higher frequencies is computed in module 500 as the average of the energies of the last two critical bands:

$$\bar{E}_h=0.5(e(18)+e(19)) \quad (3)$$

where the critical band energies e(i) are computed as a sum of the bin energies within the critical band, averaged by the number of the bins.

The energy in lower frequencies is computed as the average of the energies in the first 10 critical bands. The middle critical bands have been excluded from the computation to improve the discrimination between frames with high energy concentration in low frequencies (generally voiced) and with high energy concentration in high frequencies (generally unvoiced). In between, the energy content is not characteristic for any of the classes and would increase the decision confusion.

In module 500, the energy in low frequencies is computed differently for long pitch periods and short pitch periods. For voiced female speech segments, the harmonic structure of the spectrum can be exploited to increase the voiced-unvoiced discrimination. Thus for short pitch periods, $\bar{E}_1$ is computed bin-wise and only frequency bins sufficiently close to the speech harmonics are taken into account in the summation, i.e.

$$\bar{E}_l=\frac{1}{cnt}\cdot\sum_{i=0}^{24} e_b(i) \quad (4)$$

where $e_b(i)$ are the bin energies in the first 25 frequency bins (the DC component is not considered). Note that these 25 bins correspond to the first 10 critical bands. In the above summation, only terms related to the bins closer to the nearest harmonics than a certain frequency threshold are non zero. The counter cnt equals to the number of those non-zero terms. The threshold for a bin to be included in the sum has been fixed to 50 Hz, i.e. only bins closer than 50 Hz to the nearest harmonics are taken into account. Hence, if the structure is harmonic in low frequencies, only high energy term will be included in the sum. On the other hand, if the structure is not harmonic, the selection of the terms will be random and the sum will be smaller. Thus even unvoiced sounds with high energy content in low frequencies can be detected. This processing cannot be done for longer pitch periods, as the frequency resolution is not sufficient. The threshold pitch value is 128 samples corresponding to 100 Hz. It means that for pitch periods longer than 128 samples and also for a priori unvoiced sounds (i.e. when $\bar{r}_x$+re<0.6), the low frequency energy estimation is done per critical band and is computed as $$\overline{E}_l = \frac{1}{10}\cdot\sum_{i=0}^{9} e(i) \tag{5}$$

The value $r_e$, calculated in a noise estimation and normalized correlation correction module 501, is a correction added to the normalized correlation in presence of background noise for the following reason. In the presence of background noise, the average normalized correlation decreases. However, for purpose of signal classification, this decrease should not affect the voiced-unvoiced decision. It has been found that the dependence between this decrease re and the total background noise energy in dB is approximately exponential and can be expressed using following relationship $$r_e = 2.4492\cdot 10^{-4}\cdot e^{0.1596\cdot NdB} - 0.022$$

where $N_{dB}$ stands for $$N_{dB} = 10\cdot\log_{10}\left(\frac{1}{20}\sum_{i=0}^{19} n(i)\right) - g_{dB}$$

Here, n(i) are the noise energy estimates for each critical band normalized in the same way as e(i) and $g_{dB}$ is the maximum noise suppression level in dB allowed for the noise reduction routine. The value re is not allowed to be negative. it should be noted that when a good noise reduction algorithm is used and $g_{dB}$ is sufficiently high, $r_e$ is practically equal to zero. It is only relevant when the noise reduction is disabled or if the background noise level is significantly higher than the maximum allowed reduction. The influence of $r_e$ can be tuned by multiplying this term with a constant.

Finally, the resulting lower and higher frequency energies are obtained by subtracting an estimated noise energy from the values and $\overline{E}_1$ and $\overline{E}_1$ calculated above. That is $$E_h = \overline{E}_h - f_c\cdot N_h \tag{6}$$

$$E_1\overline{E}_1 - f_c\cdot N_l \tag{7}$$

where $N_h$ and $N_l$ are the averaged noise energies in the last two (2) critical bands and first ten (10) critical bands, respectively, computed using equations similar to Equations (3) and (5), and $f_c$ is a correction factor tuned so that these measures remain close to constant with varying the background noise level. In this illustrative embodiment, the value of $f_c$ has been fixed to 3.

The spectral tilt et is calculated in the spectral tilt estimation module 503 using the relation:

$$e_t = \frac{E_l}{E_h} \tag{8}$$

and it is averaged in the dB domain for the two (2) frequency analyses performed per frame:

$$e_t = 10\cdot\log_{10}(e_t(0)\cdot e_t(1))$$

The signal to noise ratio (SNR) measure exploits the fact that for a general waveform matching encoder, the SNR is much higher for voiced sounds. The snr parameter estimation must be done at the end of the encoder subframe loop and is computed in the SNR computation module 504 using the relation:

$$snr = \frac{E_{sw}}{E_e} \tag{9}$$

where $E_{sw}$ is the energy of the weighted speech signal $s_w(n)$ of the current frame from the perceptual weighting filter 205 and $E_e$ is the energy of the error between this weighted speech signal and the weighted synthesis signal of the current frame from the perceptual weighting filter 205'.

The pitch stability counter PC assesses the variation of the pitch period. It is computed within the signal classification module 505 in response to the open-loop pitch estimates as follows:

$$pc = |p_1 - p_0| + |p_2 - p_1| \tag{10}$$

The values $p_0$, $p_1$, $p_2$ correspond to the open-loop pitch estimates calculated by the open-loop pitch search module 206 from the first half of the current frame, the second half of the current frame and the look-ahead, respectively.

The relative frame energy $E_s$ is computed by module 500 as a difference between the current frame energy in dB and its long-term average $$E_s = \overline{E}_f - E_{lt}$$

where the frame energy $\overline{E}_f$ is obtained as a summation of the critical band energies, averaged for the both spectral analysis performed each frame:

$$\overline{E}_f = 10\ \log_{10}(0.5 E_f(0) + E_f(1)))$$

$$E_f(j) = \sum_{i=0}^{19} e(i)$$

The long-term averaged energy is updated on active speech frames using the following relation:

$$E_{lt} = 0.99 E_{lt} + 0.01 E_f$$

The last parameter is the zero-crossing parameter zc computed on one frame of the speech signal by the zero-crossing computation module 508. The frame starts in the middle of the current frame and uses two (2) subframes of the look-ahead. In this illustrative embodiment, the zero-crossing counter zc counts the number of times the signal sign changes from positive to negative during that interval.

To make the classification more robust, the classification parameters are considered together forming a function of merit fm. For that purpose, the classification parameters are first scaled between 0 and 1 so that each parameter's value typical for unvoiced signal translates in 0 and each parameter's value typical for voiced signal translates into 1. A linear function is used between them. Let us consider a parameter px, its scaled version is obtained using:

$$p^s = k_p\cdot p_x + c_p$$

and clipped between 0 and 1. The function coefficients $k_p$ and $c_p$ have been found experimentally for each of the parameters so that the signal distortion due to the concealment and recovery techniques used in presence of FERs is minimal. The values used in this illustrative implementation are summarized in Table 2:

TABLE 2

| Signal Classification Parameters and the coefficients of their respective scaling functions | | | |
|---|---|---|---|
| Parameter | Meaning | $k_p$ | $c_p$ |
| $\bar{r}_x$ | Normalized Correlation | 2.857 | −1.286 |
| $\bar{e}_t$ | Spectral Tilt | 0.04167 | 0 |
| snr | Signal to Noise Ratio | 0.1111 | −0.3333 |
| pc | Pitch Stability counter | −0.07143 | 1.857 |
| $E_s$ | Relative Frame Energy | 0.05 | 0.45 |
| zc | Zero Crossing Counter | −0.04 | 2.4 |

The merit function has been defined as:

$$f_m = \frac{1}{7}(2 \cdot \bar{r}_x^s + \bar{e}_t^s + snr^s + pc^s + E_s^s + zc^s)$$

where the superscript s indicates the scaled version of the parameters.

The classification is then done using the merit function $f_m$ and following the rules summarized in Table 3:

TABLE 3

Signal Classification Rules at the Encoder

| Previous Frame Class | Rule | Current Frame Class |
|---|---|---|
| ONSET<br>VOICED<br>VOICED<br>TRANSITION | $f_m$ = 0.66 | VOICED |
| | 0.66 > $f_m$ = 0.49 | VOICED TRANSITION |
| | $f_m$ < 0.49 | UNVOICED |
| UNVOICED<br>TRANSITION<br>UNVOICED | $f_m$ > 0.63 | ONSET |
| | 0.63 = $f_m$ > 0.585 | UNVOICED TRANSITION |
| | $f_m$ = 0.585 | UNVOICED |

In case of source-controlled variable bit rate (VBR) encoder, a signal classification is inherent to the codec operation. The codec operates at several bit rates, and a rate selection module is used to determine the bit rate used for encoding each speech frame based on the nature of the speech frame (e.g. voiced, unvoiced, transient, background noise frames are each encoded with a special encoding algorithm). The information about the coding mode and thus about the speech class is already an implicit part of the bitstream and need not be explicitly transmitted for FER processing. This class information can be then used to overwrite the classification decision described above.

In the example application to the AMR WB codec, the only source-controlled rate selection represents the voice activity detection (VAD). This VAD flag equals 1 for active speech, 0 for silence. This parameter is useful for the classification as it directly indicates that no further classification is needed if its value is 0 (i.e. the frame is directly classified as UNVOICED). This parameter is the output of the voice activity detection (VAD) module 402. Different VAD algorithms exist in the literature and any algorithm can be used for the purpose of the present invention. For instance the VAD algorithm that is part of standard G.722.2 can be used [ITU-T Recommendation G.722.2 "Wideband coding of speech at around 16 kbit/s using Adaptive Multi-Rate Wideband (AMR-WB)", Geneva, 2002]. Here, the VAD algorithm is based on the output of the spectral analysis of module 500 (based on signal-to-noise ratio per critical band). The VAD used for the classification purpose differs from the one used for encoding purpose with respect to the hangover. In speech encoders using a comfort noise generation (CNG) for segments without active speech (silence or noise-only), a hangover is often added after speech spurts (CNG in AMR-WB standard is an example [3GPP TS 26.192, "AMR Wideband Speech Codec: Comfort Noise Aspects," 3GPP Technical Specification]). During the hangover, the speech encoder continues to be used and the system switches to the CNG only after the hangover period is over. For the purpose of classification for FER concealment, this high security is not needed. Consequently, the VAD flag for the classification will equal to 0 also during the hangover period.

In this illustrative embodiment, the classification is performed in module 505 based on the parameters described above; namely, normalized correlations (or voicing information) $r_x$, spectral tilt $e_t$, snr, pitch stability counter pc, relative frame energy $E_s$, zero crossing rate zc, and VAD flag.

Classification at the Decoder

If the application does not permit the transmission of the class information (no extra bits can be transported), the classification can be still performed at the decoder. As already noted, the main disadvantage here is that there is generally no available look ahead in speech decoders. Also, there is often a need to keep the decoder complexity limited.

A simple classification can be done by estimating the voicing of the synthesized signal. If we consider the case of a CELP type encoder, the voicing estimate $r_v$ computed as in Equation (1) can be used. That is:

$$r_v = (E_v - E_c)/(E_v + E_c)$$

where $E_v$ is the energy of the scaled pitch codevector $bv_T$ and $E_c$ is the energy of the scaled innovative codevector $gc_k$. Theoretically, for a purely voiced signal rv=1 and for a purely unvoiced signal $r_v$=−1. The actual classification is done by averaging $r_v$ values every 4 subframes. The resulting factor $f_{rv}$ (average of $r_v$ values of every four subframes) is used as follows

TABLE 4

Signal Classification Rules at the Decoder

| Previous Frame Class | Rule | Current Frame Class |
|---|---|---|
| ONSET<br>VOICED<br>VOICED<br>TRANSITION | $f_{rv}$ > −0.1 | VOICED |
| | −0.1 = $f_{rv}$ = −0.5 | VOICED TRANSITION |
| | $f_{rv}$ < −0.5 | UNVOICED |
| UNVOICED<br>TRANSITION<br>UNVOICED | $f_{rv}$ > −0.1 | ONSET |
| | −0.1 = $f_{rv}$ = −0.5 | UNVOICED TRANSITION |
| | $f_{rv}$ < −0.5 | UNVOICED |

Similarly to the classification at the encoder, other parameters can be used at the decoder to help the classification, as the parameters of the LP filter or the pitch stability.

In case of source-controlled variable bit rate coder, the information about the coding mode is already a part of the bitstream. Hence, if for example a purely unvoiced coding mode is used, the frame can be automatically classified as UNVOICED. Similarly, if a purely voiced coding mode is used, the frame is classified as VOICED.

Speech Parameters for FER Processing

There are few critical parameters that must be carefully controlled to avoid annoying artifacts when FERs occur. If few extra bits can be transmitted then these parameters can be estimated at the encoder, quantized, and transmitted. Otherwise, some of them can be estimated at the decoder. These parameters include signal classification, energy information, phase information, and voicing information. The most important is a precise control of the speech energy. The phase and the speech periodicity can be controlled too for further improving the FER concealment and recovery.

The importance of the energy control manifests itself mainly when a normal operation recovers after an erased block of frames. As most of speech encoders make use of a prediction, the right energy cannot be properly estimated at the decoder. In voiced speech segments, the incorrect energy can persist for several consecutive frames which is very annoying especially when this incorrect energy increases.

Even if the energy control is most important for voiced speech because of the long term prediction (pitch prediction), it is important also for unvoiced speech. The reason here is the prediction of the innovation gain quantizer often used in CELP type coders. The wrong energy during unvoiced segments can cause an annoying high frequency fluctuation.

The phase control can be done in several ways, mainly depending on the available bandwidth. In our implementation, a simple phase control is achieved during lost voiced onsets by searching the approximate information about the glottal pulse position.

Hence, apart from the signal classification information discussed in the previous section, the most important information to send is the information about the signal energy and the position of the first glottal pulse in a frame (phase information). If enough bandwidth is available, a voicing information can be sent, too.

Energy Information

The energy information can be estimated and sent either in the LP residual domain or in the speech signal domain. Sending the information in the residual domain has the disadvantage of not taking into account the influence of the LP synthesis filter. This can be particularly tricky in the case of voiced recovery after several lost voiced frames (when the FER happens during a voiced speech segment). When a FER arrives after a voiced frame, the excitation of the last good frame is typically used during the concealment with some attenuation strategy. When a new LP synthesis filter arrives with the first good frame after the erasure, there can be a mismatch between the excitation energy and the gain of the LP synthesis filter. The new synthesis filter can produce a synthesis signal with an energy highly different from the energy of the last synthesized erased frame and also from the original signal energy. For this reason, the energy is computed and quantized in the signal domain.

The energy $E_q$ is computed and quantized in energy estimation and quantization module 506. It has been found that 6 bits are sufficient to transmit the energy. However, the number of bits can be reduced without a significant effect if not enough bits are available. In this preferred embodiment, a 6 bit uniform quantizer is used in the range of −15 dB to 83 dB with a step of 1.58 dB. The quantization index is given by the integer part of:

$$i = \frac{10\log_{10}(E + 0.001) + 15}{1.58} \tag{15}$$

where E is the maximum of the signal energy for frames classified as VOICED or ONSET, or the average energy per sample for other frames. For VOICED or ONSET frames, the maximum of signal energy is computed pitch synchronously at the end of the frame as follow:

$$E = \max_{i=L-t_E}^{L-1} (s^2(i)) \tag{16}$$

where L is the frame length and signal s(i) stands for speech signal (or the denoised speech signal if a noise suppression is used). In this illustrative embodiment s(i) stands for the input signal after downsampling to 12.8 kHz and pre-processing. If the pitch delay is greater than 63 samples, $t_E$ equals the rounded close-loop pitch lag of the last subframe. If the pitch delay is shorter than 64 samples, then $t_E$ is set to twice the rounded close-loop pitch lag of the last subframe.

For other classes, E is the average energy per sample of the second half of the current frame, i.e. $t_E$ is set to L/2 and the E is computed as:

$$E = \frac{1}{t_E} \sum_{i=L-t_E}^{L-1} s^2(i) \tag{17}$$

Phase Control Information

The phase control is particularly important while recovering after a lost segment of voiced speech for similar reasons as described in the previous section. After a block of erased frames, the decoder memories become desynchronized with the encoder memories. To resynchronize the decoder, some phase information can be sent depending on the available bandwidth. In the described illustrative implementation, a rough position of the first glottal pulse in the frame is sent. This information is then used for the recovery after lost voiced onsets as will be described later.

Let $T_0$ be the rounded closed-loop pitch lag for the first subframe. First glottal pulse search and quantization module 507 searches the position of the first glottal pulse τ among the $T_0$ first samples of the frame by looking for the sample with the maximum amplitude. Best results are obtained when the position of the first glottal pulse is measured on the low-pass filtered residual signal.

The position of the first glottal pulse is coded using 6 bits in the following manner. The precision used to encode the position of the first glottal pulse depends on the closed-loop pitch value for the first subframe $T_0$. This is possible because this value is known both by the encoder and the decoder, and is not subject to error propagation after one or several frame losses. When $T_0$ is less than 64, the position of the first glottal pulse relative to the beginning of the frame is encoded directly with a precision of one sample. When $64=T_0<128$, the position of the first glottal pulse relative to the beginning of the frame is encoded with a precision of two samples by using a simple integer division, i.e. τ/2. When $T_0=128$, the position of the first glottal pulse relative to the beginning of the frame is encoded with a precision of four samples by further dividing τ by 2. The inverse procedure is done at the decoder. If $T_0<64$, the received quantized position is used as is. If $64=T_0<128$, the received quantized position is multiplied by 2 and incremented by 1. If $T_0=128$, the received quantized position is multiplied by 4 and incremented by 2 (incrementing by 2 results in uniformly distributed quantization error).

According to another embodiment of the invention where the shape of the first glottal pulse is encoded, the position of the first glottal pulse is determined by a correlation analysis between the residual signal and the possible pulse shapes, signs (positive or negative) and positions. The pulse shape can be taken from a codebook of pulse shapes known at both the encoder and the decoder, this method being known as vector quantization by those of ordinary skill in the art. The shape, sign and amplitude of the first glottal pulse are then encoded and transmitted to the decoder.

Periodicity Information

In case there is enough bandwidth, a periodicity information, or voicing information, can be computed and transmitted, and used at the decoder to improve the frame erasure concealment. The voicing information is estimated based on the normalized correlation. It can be encoded quite precisely with 4 bits, however, 3 or even 2 bits would suffice if necessary. The voicing information is necessary in general only for frames with some periodic components and better voicing resolution is needed for highly voiced frames. The normalized correlation is given in Equation (2) and it is used as an indicator to the voicing Information. It is quantized in first glottal pulse search and quantization module 507. In this illustrative embodiment, a piece-wise linear quantizer has been used to encode the voicing information as follows:

$$i = \frac{r_x(2) - 0.65}{0.03} + 0.5, \quad \text{for } r_X(2) < 0.92 \tag{18}$$

$$i = 9 + \frac{r_x(2) - 0.92}{0.01} + 0.5, \quad \text{for } r_X(2) \geq 0.92 \tag{19}$$

Again, the integer part of i is encoded and transmitted. The correlation $r_x(2)$ has the same meaning as in Equation (1). In Equation (18) the voicing is linearly quantized between 0.65 and 0.89 with the step of 0.03. In Equation (19) the voicing is linearly quantized between 0.92 and 0.98 with the step of 0.01.

If larger quantization range is needed, the following linear quantization can be used:

$$i = \frac{\bar{r}_x - 0.4}{0.04} + 0.5 \tag{20}$$

This equation quantizes the voicing in the range of 0.4 to 1 with the step of 0.04. The correlation $\bar{r}_x$ is defined in Equation (2a).

The equations (18) and (19) or the equation (20) are then used in the decoder to compute $r_x(2)$ or $\bar{r}_x$. Let us call this quantized normalized correlation $r_q$. If the voicing cannot be transmitted, it can be estimated using the voicing factor from Equation (2a) by mapping it in the range from 0 to 1.

$$r_q = 0.5 \cdot (f+1) \tag{21}$$

Processing of Erased Frames

The FER concealment techniques in this illustrative embodiment are demonstrated on ACELP type encoders. They can be however easily applied to any speech codec where the synthesis signal is generated by filtering an excitation signal through an LP synthesis filter. The concealment strategy can be summarized as a convergence of the signal energy and the spectral envelope to the estimated parameters of the background noise. The periodicity of the signal is converging to zero. The speed of the convergence is dependent on the parameters of the last good received frame class and the number of consecutive erased frames and is controlled by an attenuation factor α. The factor α is further dependent on the stability of the LP filter for UNVOICED frames. In general, the convergence is slow if the last good received frame is in a stable segment and is rapid if the frame is in a transition segment. The values of a are summarized in Table 5.

TABLE 5

Values of the FER concealment attenuation factor α

| Last Good Received Frame | Number of successive erased frames | α |
|---|---|---|
| ARTIFICIAL ONSET | | 0.6 |
| ONSET, VOICED | =3 | 1.0 |
| | >3 | 0.4 |
| VOICED TRANSITION | | 0.4 |
| UNVOICED TRANSITION | | 0.8 |
| UNVOICED | =1 | 0.6 θ + 0.4 |
| | >1 | 0.4 |

A stability factor θ is computed based on a distance measure between the adjacent LP filters. Here, the factor θ is related to the ISF (Immittance Spectral Frequencies) distance measure and it is bounded by $0 \leqq \theta \leqq 1$, with larger values of θ corresponding to more stable signals. This results in decreasing energy and spectral envelope fluctuations when an isolated frame erasure occurs inside a stable unvoiced segment.

The signal class remains unchanged during the processing of erased frames, i.e. the class remains the same as in the last good received frame.

Construction of the Periodic Part of the Excitation

For a concealment of erased frames following a correctly received UNVOICED frame, no periodic part of the excitation signal is generated. For a concealment of erased frames following a correctly received frame other than UNVOICED, the periodic part of the excitation signal is constructed by repeating the last pitch period of the previous frame. If it is the case of the 1 st erased frame after a good frame, this pitch pulse is first low-pass filtered. The filter used is a simple 3-tap linear phase FIR filter with filter coefficients equal to 0.18, 0.64 and 0.18. If a voicing information is available, the filter can be also selected dynamically with a cut-off frequency dependent on the voicing.

The pitch period $T_c$ used to select the last pitch pulse and hence used during the concealment is defined so that pitch multiples or submultiples can be avoided, or reduced. The following logic is used in determining the pitch period $T_c$.

if (($T_3$<1.8 $T_s$) AND ($T_3$>0.6 $T_s$)) OR ($T_{cnt}$=30), then $T_c$=$T_3$, else $T_c$=$T_s$.

Here, $T_3$ is the rounded pitch period of the $4^{th}$ subframe of the last good received frame and $T_s$ is the rounded pitch period of the $4^{th}$ subframe of the last good stable voiced frame with coherent pitch estimates. A stable voiced frame is defined here as a VOICED frame preceded by a frame of voiced type (VOICED TRANSITION, VOICED, ONSET). The coherence of pitch is verified in this implementation by examining whether the closed-loop pitch estimates are reasonably close, i.e. whether the ratios between the last subframe pitch, the 2nd subframe pitch and the last subframe pitch of the previous frame are within the interval (0.7, 1.4).

This determination of the pitch period $T_c$ means that if the pitch at the end of the last good frame and the pitch of the last stable frame are close to each other, the pitch of the last good frame is used. Otherwise this pitch is considered unreliable and the pitch of the last stable frame is used instead to avoid the impact of wrong pitch estimates at voiced onsets. This logic makes however sense only if the last stable segment is not too far in the past. Hence a counter $T_{cnt}$ is defined that limits the reach of the influence of the last stable segment. If $T_{cnt}$ is greater or equal to 30, i.e. if there are at least 30 frames since the last $T_s$ update, the last good frame pitch is used systematically. $T_{cnt}$ is reset to 0 every time a stable segment is detected and $T_s$ is updated. The period $T_c$ is then maintained constant during the concealment for the whole erased block.

As the last pulse of the excitation of the previous frame is used for the construction of the periodic part, its gain is approximately correct at the beginning of the concealed frame and can be set to 1. The gain is then attenuated linearly throughout the frame on a sample by sample basis to achieve the value of α at the end of the frame.

The values of α correspond to the Table 5 with the exception that they are modified for erasures following VOICED and ONSET frames to take into consideration the energy evolution of voiced segments. This evolution can be extrapolated to some extend by using the pitch excitation gain values of each subframe of the last good frame. In general, if these gains are greater than 1, the signal energy is increasing, if they are lower than 1, the energy is decreasing. α is thus multiplied by a correction factor $f_b$ computed as follows:

$$f_b=\sqrt{0.1b(0)+0.2b(1)+0.3b(2)+0.4b(3)} \tag{23}$$

where b(0), b(1), b(2) and b(3) are the pitch gains of the four subframes of the last correctly received frame. The value of $f_b$ is clipped between 0.98 and 0.85 before being used to scale the periodic part of the excitation. In this way, strong energy increases and decreases are avoided.

For erased frames following a correctly received frame other than UNVOICED, the excitation buffer is updated with this periodic part of the excitation only. This update will be used to construct the pitch codebook excitation in the next frame.

Construction of the Random Part of the Excitation

The innovation (non-periodic) part of the excitation signal is generated randomly. It can be generated as a random noise or by using the CELP innovation codebook with vector indexes generated randomly. In the present illustrative embodiment, a simple random generator with approximately uniform distribution has been used. Before adjusting the innovation gain, the randomly generated innovation is scaled to some reference value, fixed here to the unitary energy per sample.

At the beginning of an erased block, the innovation gain gs is initialized by using the innovation excitation gains of each subframe of the last good frame:

$$g_s=0.1g(0)+0.2g(1)+0.3g(2)+0.4g(3) \tag{23a}$$

where g(0), g(1), g(2) and g(3) are the fixed codebook, or innovation, gains of the four (4) subframes of the last correctly received frame. The attenuation strategy of the random part of the excitation is somewhat different from the attenuation of the pitch excitation. The reason is that the pitch excitation (and thus the excitation periodicity) is converging to 0 while the random excitation is converging to the comfort noise generation (CNG) excitation energy. The innovation gain attenuation is done as:

$$g_s^{1}=\alpha\cdot g_s^{0}+(1-\alpha)\cdot g_n \tag{24}$$

where $g_s^1$ is the innovation gain at the beginning of the next frame, $g_s^0$ is the innovative gain at the beginning of the current frame, $g_n$ is the gain of the excitation used during the comfort noise generation and a is as defined in Table 5. Similarly to the periodic excitation attenuation, the gain is thus attenuated linearly throughout the frame on a sample by sample basis starting with $g_s^0$ and going to the value of $g_s^1$ that would be achieved at the beginning of the next frame.

Finally, if the last good (correctly received or non erased) received frame is different from UNVOICED, the innovation excitation is filtered through a linear phase FIR high-pass filter with coefficients −0.0125, −0.109, 0.7813, −0.109, −0.0125. To decrease the amount of noisy components during voiced segments, these filter coefficients are multiplied by an adaptive factor equal to (0.75-0.25 $r_v$), $r_v$ being the voicing factor as defined in Equation (1). The random part of the excitation is then added to the adaptive excitation to form the total excitation signal.

If the last good frame is UNVOICED, only the innovation excitation is used and it is further attenuated by a factor of 0.8. In this case, the past excitation buffer is updated with the innovation excitation as no periodic part of the excitation is available.

Spectral Envelope Concealment, Synthesis and Updates

To synthesize the decoded speech, the LP filter parameters must be obtained. The spectral envelope is gradually moved to the estimated envelope of the ambient noise. Here the ISF representation of LP parameters is used:

$$l^1(j)=\alpha l^0(j)+(1-\alpha)l_n(j),\ j=0,\ldots,p-1 \tag{25}$$

In equation (25), $l^1(j)$ is the value of the $j^{th}$ ISF of the current frame, 106) is the value of the $j^{th}$ ISF of the previous frame, $l^n(j)$ is the value of the $j^{th}$ ISF of the estimated comfort noise envelope and p is the order of the LP filter.

The synthesized speech is obtained by filtering the excitation signal through the LP synthesis filter. The filter coefficients are computed from the ISF representation and are interpolated for each subframe (four (4) times per frame) as during normal encoder operation.

As innovation gain quantizer and ISF quantizer both use a prediction, their memory will not be up to date after the normal operation is resumed. To reduce this effect, the quantizers' memories are estimated and updated at the end of each erased frame.

Recovery of the Normal Operation After Erasure

The problem of the recovery after an erased block of frames is basically due to the strong prediction used practically in all modern speech encoders. In particular, the CELP type speech coders achieve their high signal to noise ratio for voiced speech due to the fact that they are using the past excitation signal to encode the present frame excitation (long-term or pitch prediction). Also, most of the quantizers (LP quantizers, gain quantizers) make use of a prediction.

Artificial Onset Construction

The most complicated situation related to the use of the long-term prediction in CELP encoders is when a voiced onset is lost. The lost onset means that the voiced speech onset happened somewhere during the erased block. In this case, the last good received frame was unvoiced and thus no periodic excitation is found in the excitation buffer. The first good frame after the erased block is however voiced, the excitation buffer at the encoder is highly periodic and the adaptive excitation has been encoded using this periodic past excitation. As this periodic part of the excitation is completely missing at the decoder, it can take up to several frames to recover from this loss.

Figure 6:
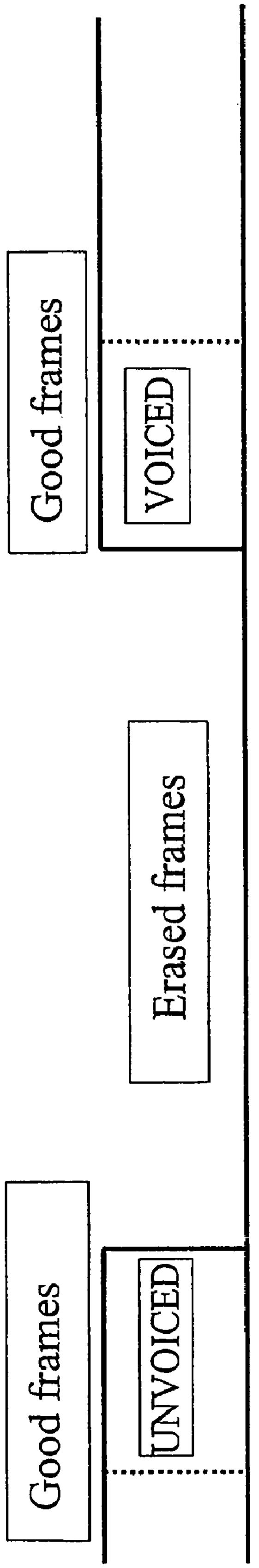
FIG. 6 is a block diagram explaining the situation when an artificial onset is constructed.

If an ONSET frame is lost (i.e. a VOICED good frame arrives after an erasure, but the last good frame before the erasure was UNVOICED as shown in FIG. 6), a special technique is used to artificially reconstruct the lost onset and to trigger the voiced synthesis. At the beginning of the 1st good frame after a lost onset, the periodic part of the excitation is constructed artificially as a low-pass filtered periodic train of pulses separated by a pitch period. In the present illustrative embodiment, the low-pass filter is a simple linear phase FIR filter with the impulse response $h_{low}=\{-0.0125, 0.109, 0.7813, 0.109, -0.0125\}$. However, the filter could be also selected dynamically with a cut-off frequency corresponding to the voicing information if this information is available. The innovative part of the excitation is constructed using normal CELP decoding. The entries of the innovation codebook could be also chosen randomly (or the innovation itself could be generated randomly), as the synchrony with the original signal has been lost anyway.

In practice, the length of the artificial onset is limited so that at least one entire pitch period is constructed by this method and the method is continued to the end of the current subframe. After that, a regular ACELP processing is resumed. The pitch period considered is the rounded average of the decoded pitch periods of all subframes where the artificial onset reconstruction is used. The low-pass filtered impulse train is realized by placing the impulse responses of the low-pass filter in the adaptive excitation buffer (previously initialized to zero). The first impulse response will be centered at the quantized position $\tau_q$ (transmitted within the bitstream) with respect to the frame beginning and the remaining impulses will be placed with the distance of the averaged pitch up to the end of the last subframe affected by the artificial onset construction. If the available bandwidth is not sufficient to transmit the first glottal pulse position, the first impulse response can be placed arbitrarily around the half of the pitch period after the current frame beginning.

As an example, for the subframe length of 64 samples, let us consider that the pitch periods in the first and the second subframe be p(0)=70.75 and p(1)=71. Since this is larger than the subframe size of 64, then the artificial onset will be constructed during the first two subframes and the pitch period will be equal to the pitch average of the two subframes rounded to the nearest integer, i.e. 71. The last two subframes will be processed by normal CELP decoder.

The energy of the periodic part of the artificial onset excitation is then scaled by the gain corresponding to the quantized and transmitted energy for FER concealment (As defined in Equations 16 and 17) and divided by the gain of the LP synthesis filter. The LP synthesis filter gain is computed as:

$$g_{LP}=\sqrt{\sum_{i=0}^{63} h^2(i)} \tag{31}$$

where h(i) is the LP synthesis filter impulse response Finally, the artificial onset gain is reduced by multiplying the periodic part with 0.96. Alternatively, this value could correspond to the voicing if there were a bandwidth available to transmit also the voicing information. Alternatively without diverting from the essence of this invention, the artificial onset can be also constructed in the past excitation buffer before entering the decoder subframe loop. This would have the advantage of avoiding the special processing to construct the periodic part of the artificial onset and the regular CELP decoding could be used instead.

The LP filter for the output speech synthesis is not interpolated in the case of an artificial onset construction. Instead, the received LP parameters are used for the synthesis of the whole frame.

Energy Control

The most important task at the recovery after an erased block of frames is to properly control the energy of the synthesized speech signal. The synthesis energy control is needed because of the strong prediction usually used in modem speech coders. The energy control is most important when a block of erased frames happens during a voiced segment. When a frame erasure arrives after a voiced frame, the excitation of the last good frame is typically used during the concealment with some attenuation strategy. When a new LP filter arrives with the first good frame after the erasure, there can be a mismatch between the excitation energy and the gain of the new LP synthesis filter. The new synthesis filter can produce a synthesis signal with an energy highly different from the energy of the last synthesized erased frame and also from the original signal energy.

The energy control during the first good frame after an erased frame can be summarized as follows. The synthesized signal is scaled so that its energy is similar to the energy of the synthesized speech signal at the end of the last erased frame at the beginning of the first good frame and is converging to the transmitted energy towards the end of the frame with preventing a too important energy increase.

The energy control is done in the synthesized speech signal domain. Even if the energy is controlled in the speech domain, the excitation signal must be scaled as it serves as long term prediction memory for the following frames. The synthesis is then redone to smooth the transitions. Let $g_0$ denote the gain used to scale the 1st sample in the current frame and $g_1$ the gain used at the end of the frame. The excitation signal is then scaled as follows:

$$u_s(i)=g_{AGC}(i)\cdot u(i),\ i=0, \ldots, L-1 \tag{32}$$

where $u_s(i)$ is the scaled excitation, u(i) is the excitation before the scaling, L is the frame length and $g_{AGC}(i)$ is the gain starting from $g_0$ and converging exponentially to $g_1$:

$$g_{AGC}(i)=f_{AGC}g_{AGC}(i-1)+(1-f_{AGC})g_1\ i=0, \ldots, L-1$$

with the initialization of $g_{AGC}(-1)=g_0$, where $f_{AGC}$ is the attenuation factor set in this implementation to the value of 0.98. This value has been found experimentally as a compromise of having a smooth transition from the previous (erased) frame on one side, and scaling the last pitch period of the current frame as much as possible to the correct (transmitted) value on the other side. This is important because the transmitted energy value is estimated pitch synchronously at the end of the frame. The gains g0 and g1 are defined as:

$$g_0=\sqrt{E_{-1}/E_0} \tag{33a}$$

$$g_1=\sqrt{E_q/E_1} \tag{33b}$$

where $E_{-1}$ is the energy computed at the end of the previous (erased) frame, $E_0$ is the energy at the beginning of the current (recovered) frame, $E_1$ is the energy at the end of the current frame and $E_q$ is the quantized transmitted energy information at the end of the current frame, computed at the encoder from Equations (16, 17). $E_{-1}$ and $E_1$ are computed similarly with the exception that they are computed on the synthesized speech signal s'. $E_{-1}$ is computed pitch synchronously using the concealment pitch period $T_c$ and $E_1$ uses the last subframe rounded pitch $T_3$. $E_0$ is computed similarly using the rounded pitch value $T_0$ of the first subframe, the equations (16, 17) being modified to:

$$E = \max_{i=0}^{t_E}(s'^2(i))$$

for VOICED and ONSET frames. $t_E$ equals to the rounded pitch lag or twice that length if the pitch is shorter than 64 samples. For other frames, $$E = \frac{1}{t_0}\sum_{i=0}^{t_E} s'^2(i)$$

with $t_E$ equal to the half of the frame length. The gains $g_0$ and $g_1$ are further limited to a maximum allowed value, to prevent strong energy. This value has been set to 1.2 in the present illustrative implementation.

Conducting frame erasure concealment and decoder recovery comprises, when a gain of a LP filter of a first non erased frame received following frame erasure is higher than a gain of a LP filter of a last frame erased during said frame erasure, adjusting the energy of an LP filter excitation signal produced in the decoder during the received first non erased frame to a gain of the LP filter of said received first non erased frame using the following relation:

If $E_q$ cannot be transmitted, $E_q$ is set to $E_1$. If however the erasure happens during a voiced speech segment (i.e. the last good frame before the erasure and the first good frame after the erasure are classified as VOICED TRANSITION, VOICED or ONSET), further precautions must be taken because of the possible mismatch between the excitation signal energy and the LP filter gain, mentioned previously. A particularly dangerous situation arises when the gain of the LP filter of a first non erased frame received following frame erasure is higher than the gain of the LP filter of a last frame erased during that frame erasure. In that particular case, the energy of the LP filter excitation signal produced in the decoder during the received first non erased frame is adjusted to a gain of the LP filter of the received first non erased frame using the following relation:

$$E_q = E_1 \frac{E_{LP0}}{E_{LP1}}$$

where $E_{LPO}$ is the energy of the LP filter impulse response of the last good frame before the erasure and $E_{LP1}$ is the energy of the LP filter of the first good frame after the erasure. In this implementation, the LP filters of the last subframes in a frame are used. Finally, the value of $E_q$ is limited to the value of $E_{-1}$ in this case (voiced segment erasure without $E_q$ information being transmitted).

The following exceptions, all related to transitions in speech signal, further overwrite the computation of $g_0$. If artificial onset is used in the current frame, $g_0$ is set to 0.5 $g_1$, to make the onset energy increase gradually.

In the case of a first good frame after an erasure classified as ONSET, the gain $g_0$ is prevented to be higher that $g_1$. This precaution is taken to prevent a positive gain adjustment at the beginning of the frame (which is probably still at least partially unvoiced) from amplifying the voiced onset (at the end of the frame).

Finally, during a transition from voiced to, unvoiced (i.e. that last good frame being classified as VOICED TRANSITION, VOICED or ONSET and the current frame being classified UNVOICED) or during a transition from a non-active speech period to active speech period (last good received frame being encoded as comfort noise and current frame being encoded as active speech), the $g_0$ is set to $g_1$.

In case of a voiced segment erasure, the wrong energy problem can manifest itself also in frames following the first good frame after the erasure. This can happen even if the first good frame's energy has been adjusted as described above. To attenuate this problem, the energy control can be continued up to the end of the voiced segment.

Although the present invention has been described in the foregoing description in relation to an illustrative embodiment thereof, this illustrative embodiment can be modified as will, within the scope of the appended claims without departing from the scope and spirit of the subject invention.

What is claimed is:

1. A method of concealing frame erasure caused by frames of an encoded sound signal erased during transmission from an encoder to a decoder, comprising:

determining, in the encoder, concealment/recovery parameters related to the sound signal;

transmitting to the decoder concealment/recovery parameters determined in the encoder; and in the decoder, conducting frame erasure concealment and decoder recovery in response to the received concealment/recovery parameters;

wherein:

conducting frame erasure concealment and decoder recovery comprises, when at least one onset frame is lost, constructing a periodic excitation part artificially as a low-pass filtered periodic train of pulses separated by a pitch period;

the method comprises quantizing a position of a first glottal pulse with respect to the beginning of the onset frame prior to transmission of said position of the first glottal pulse to the decoder; and constructing the periodic excitation part comprises realizing the low-pass filtered periodic train of pulses by:

centering a first impulse response of a low-pass filter on the quantized position of the first glottal pulse with respect to the beginning of the onset frame; and placing remaining impulse responses of the low-pass filter each with a distance corresponding to an average pitch value from the preceding impulse response up to the end of a last subframe affected by the artificial construction of the periodic part.

2. A method of concealing frame erasure caused by frames of an encoded sound signal erased during transmission from an encoder to a decoder, comprising:

determining, in the encoder, concealment/recovery parameters selected from the group consisting of a signal classification parameter, an energy information parameter, and a phase information parameter related to the sound signal;

transmitting to the decoder concealment/recovery parameters determined in the encoder; and in the decoder, conducting frame erasure concealment and decoder recovery in response to the received concealment/recovery parameters;

wherein the concealment/recovery parameters include the phase information parameter and wherein determination of the phase information parameter comprises:

determining a position of a first glottal pulse in a frame of the encoded sound signal; and encoding, in the encoder, a shape, sign and amplitude of the first glottal pulse and transmitting the encoded shape, sign and amplitude from the encoder to the decoder.

3. A method of concealing frame erasure caused by frames of an encoded sound signal erased during transmission from an encoder to a decoder, comprising:

determining, in the encoder, concealment/recovery parameters selected from the group consisting of a signal classification parameter, an energy information parameter, and a phase information parameter related to the sound signal;

transmitting to the decoder concealment/recovery parameters determined in the encoder; and in the decoder, conducting frame erasure concealment and decoder recovery in response to the received concealment/recovery parameters;

wherein:

the concealment/recovery parameters include the phase information parameter;

determination of the phase information parameter comprises determining a position of a first glottal pulse in a frame of the encoded sound signal; and determining the position of the first glottal pulse comprises: measuring a sample of maximum amplitude within a pitch period as the first glottal pulse; and quantizing a position of the sample of maximum amplitude within the pitch period.

4. A method of concealing frame erasure caused by frames of an encoded sound signal erased during transmission from an encoder to a decoder, comprising:

determining, in the encoder, concealment/recovery parameters selected from the group consisting of a signal classification parameter, an energy information parameter, and a phase information parameter related to the sound signal;

transmitting to the decoder concealment/recovery parameters determined in the encoder; and in the decoder, conducting frame erasure concealment and decoder recovery in response to the received concealment/recovery parameters;

wherein:

the sound signal is a speech signal;

determining, in the encoder, concealment/recovery parameters comprises classifying successive frames of the encoded sound signal as unvoiced, unvoiced transition, voiced transition, voiced, or onset; and determining concealment/recovery parameters comprises calculating the energy information parameter in relation to a maximum of a signal energy for frames classified as voiced or onset, and calculating the energy information parameter in relation to an average energy per sample for other frames.

5. A method of concealing frame erasure caused by frames of an encoded sound signal erased during transmission from an encoder to a decoder, comprising:

determining, in the encoder, concealment/recovery parameters selected from the group consisting of a signal classification parameter, an energy information parameter, and a phase information parameter related to the sound signal;

transmitting to the decoder concealment/recovery parameters determined in the encoder; and in the decoder, conducting frame erasure concealment and decoder recovery in response to the received concealment/recovery parameters;

wherein conducting frame erasure concealment and decoder recovery comprises:

controlling an energy of a synthesized sound signal produced by the decoder, controlling energy of the synthesized sound signal comprising scaling the synthesized sound signal to render an energy of said synthesized sound signal at the beginning of a first non erased frame received following frame erasure similar to an energy of said synthesized sound signal at the end of a last frame erased during said frame erasure; and converging the energy of the synthesized sound signal in the received first non erased frame to an energy corresponding to the received energy information parameter toward the end of said received first non erased frame while limiting an increase in energy.

6. A method as claimed in claim 5, wherein:

the sound signal is a speech signal;

determining, in the encoder, concealment/recovery parameters comprises classifying successive frames of the encoded sound signal as unvoiced, unvoiced transition, voiced transition, voiced, or onset; and when the first non erased frame received after a frame erasure is classified as onset, conducting frame erasure concealment and decoder recovery comprises limiting to a given value a gain used for scaling the synthesized sound signal.

7. A method as claimed in claim 5, wherein:

the sound signal is a speech signal;

determining, in the encoder, concealment/recovery parameters comprises classifying successive frames of the encoded sound signal as unvoiced, unvoiced transition, voiced transition, voiced, or onset; and said method comprising making a gain used for scaling the synthesized sound signal at the beginning of the first non erased frame received after frame erasure equal to a gain used at an end of said received first non erased frame:

during a transition from a voiced frame to an unvoiced frame, in the case of a last non erased frame received before frame erasure classified as voiced transition, voice or onset and a first non erased frame received after frame erasure classified as unvoiced; and during a transition from a non-active speech period to an active speech period, when the last non erased frame received before frame erasure is encoded as comfort noise and the first non erased frame received after frame erasure is encoded as active speech.

8. A method of concealing frame erasure caused by frames of an encoded sound signal erased during transmission from an encoder to a decoder, comprising:

determining, in the encoder, concealment/recovery parameters selected from the group consisting of a signal classification parameter, an energy information parameter, and a phase information parameter related to the sound signal;

transmitting to the decoder concealment/recovery parameters determined in the encoder; and in the decoder, conducting frame erasure concealment and decoder recovery in response to the received concealment/recovery parameters;

wherein:

the energy information parameter is not transmitted from the encoder to the decoder; and conducting frame erasure concealment and decoder recovery comprises, when a gain of a LP filter of a first non erased frame received following frame erasure is higher than a gain of a LP filter of a last frame erased during said frame erasure, adjusting an energy of an LP filter excitation signal produced in the decoder during the received first non erased frame to the gain of the LP filter of said received first non erased frame.

9. A method as claimed in claim 8 wherein:

adjusting the energy of the LP filter excitation signal produced in the decoder during the received first non erased frame to the gain of the LP filter of said received first non erased frame comprises using the following relation:

$$E_q = E_1 \frac{E_{LP0}}{E_{LP1}}$$

where $E_1$ is an energy at an end of the current frame, $E_{LPO}$ is an energy of an impulse response of the LP filter of a last non erased frame received before the frame erasure, and $E_{LP1}$ is an energy of an impulse response of the LP filter of the received first non erased frame following frame erasure.

10. A method of concealing frame erasure caused by frames of an encoded sound signal erased during transmission from an encoder to a decoder, comprising:

determining, in the encoder, concealment/recovery parameters selected from the group consisting of a signal classification parameter, an energy information parameter and a phase information parameter related to the sound signal; and transmitting to the decoder concealment/recovery parameters determined in the encoder;

wherein the concealment/recovery parameters include the phase information parameter and wherein determination of the phase information parameter comprises:

determining a position of a first glottal pulse in a frame of the encoded sound signal; and encoding, in the encoder, a shape, sign and amplitude of the first glottal pulse and transmitting the encoded shape, sign and amplitude from the encoder to the decoder.

11. A method of concealing frame erasure caused by frames of an encoded sound signal erased during transmission from an encoder to a decoder, comprising:

determining, in the encoder, concealment/recovery parameters selected from the group consisting of a signal classification parameter, an energy information parameter and a phase information parameter related to the sound signal; and transmitting to the decoder concealment/recovery parameters determined in the encoder;

wherein:

the concealment/recovery parameters include the phase information parameter;

determination of the phase information parameter comprises determining a position of a first glottal pulse in a frame of the encoded sound signal; and determining the position of the first glottal pulse comprises: measuring a sample of maximum amplitude within a pitch period as the first glottal pulse; and quantizing a position of the sample of maximum amplitude within the pitch period.

12. A method for the concealment of frame erasure caused by frames erased during transmission of a sound signal encoded under the form of signal-encoding parameters from an encoder to a decoder, comprising:

determining, in the decoder, concealment/recovery parameters from the signal-encoding parameters, wherein the concealment/recovery parameters are selected from the group consisting of a signal classification parameter, an energy information parameter and a phase information parameter related to the sound signal and are used for producing, upon occurrence of frame erasure, a replacement frame selected from the group consisting of a voiced frame, an unvoiced frame, and a frame defining a transition between voiced and unvoiced frames; and in the decoder, conducting frame erasure concealment and decoder recovery in response to concealment/recovery parameters determined in the decoder;

wherein:

the concealment/recovery parameters include the energy information parameter;

the energy information parameter is not transmitted from the encoder to the decoder; and conducting frame erasure concealment and decoder recovery comprises, when a gain of a LP filter of a first non erased frame received following frame erasure is higher than a gain of a LP filter of a last frame erased during said frame erasure, adjusting an energy of an LP filter excitation signal produced in the decoder during the received first non erased frame to a gain of the LP filter of said received first non erased frame using the following relation:

$$E_q = E_1 \frac{E_{LP0}}{E_{LP1}}$$

where $E_1$ is an energy at an end of the current frame, $E_{LPO}$ is an energy of an impulse response of the LP filter of a last non erased frame received before the frame erasure, and $E_{LP1}$ is an energy of an impulse response of the LP filter of the received first non erased frame following frame erasure.

13. A device for conducting concealment of frame erasure caused by frames of an encoded sound signal erased during transmission from an encoder to a decoder, comprising:

in the encoder, a determiner of concealment/recovery parameters related to the sound signal; and a communication link for transmitting to the decoder concealment/recovery parameters determined in the encoder:

wherein:

the decoder conducts frame erasure concealment and decoder recovery in response to the concealment/recovery parameters received from the encoder;

for conducting frame erasure concealment and decoder recovery, the decoder constructs, when at least one onset frame is lost, a periodic excitation part artificially as a low-pass filtered periodic train of pulses separated by a pitch period;

the device comprises a quantizer of a position of a first glottal pulse with respect to the beginning of the onset frame prior to transmission of said position of the first glottal pulse to the decoder; and the decoder, for constructing the periodic excitation part, realizes the low-pass filtered periodic train of pulses by:

centering a first impulse response of a low-pass filter on the quantized position of the first glottal pulse with respect to the beginning of the onset frame; and placing remaining impulse responses of the low-pass filter each with a distance corresponding to an average pitch value from the preceding impulse response up to an end of a last subframe affected by the artificial construction of the periodic part.

14. A device for conducting concealment of frame erasure caused by frames of an encoded sound signal erased during transmission from an encoder to a decoder, comprising:

in the encoder, a determiner of concealment/recovery parameters selected from the group consisting of a signal classification parameter, an energy information parameter and a phase information parameter related to the sound signal; and a communication link for transmitting to the decoder concealment/recovery parameters determined in the encoder;

wherein:

the decoder conducts frame erasure concealment and decoder recovery in response to the concealment/recovery parameters received from the encoder;

the concealment/recovery parameters include the phase information parameter;

to determine the phase information parameter, the determiner comprises a searcher of a position of a first glottal pulse in a frame of the encoded sound signal;

the searcher encodes a shape, sign and amplitude of the first glottal pulse and the communication link transmits the encoded shape, sign and amplitude from the encoder to the decoder.

15. A device for conducting concealment of frame erasure caused by frames of an encoded sound signal erased during transmission from an encoder to a decoder, comprising:

in the encoder, a determiner of concealment/recovery parameters selected from the group consisting of a signal classification parameter, an energy information parameter and a phase information parameter related to the sound signal; and a communication link for transmitting to the decoder concealment/recovery parameters determined in the encoder;

wherein:

the decoder conducts frame erasure concealment and decoder recovery in response to the concealment/recovery parameters received from the encoder;

the concealment/recovery parameters include the phase information parameter;

to determine the phase information parameter, the determiner comprises a searcher of a position of a first glottal pulse in a frame of the encoded sound signal; and the searcher measures a sample of maximum amplitude within a pitch period as the first glottal pulse, and the determiner comprises a quantizer of the position of the sample of maximum amplitude within the pitch period.

16. A device for conducting concealment of frame erasure caused by frames of an encoded sound signal erased during transmission from an encoder to a decoder, comprising:

in the encoder, a determiner of concealment/recovery parameters selected from the group consisting of a signal classification parameter, an energy information parameter and a phase information parameter related to the sound signal; and a communication link for transmitting to the decoder concealment/recovery parameters determined in the encoder;

wherein:

the decoder conducts frame erasure concealment and decoder recovery in response to the concealment/recovery parameters received from the encoder;

the sound signal is a speech signal;

the determiner of concealment/recovery parameters comprises a classifier of successive frames of the encoded sound signal as unvoiced, unvoiced transition, voiced transition, voiced, or onset; and the determiner of concealment/recovery parameters comprises a computer of the energy information parameter in relation to a maximum of a signal energy for frames classified as voiced or onset, and in relation to an average energy per sample for other frames.

17. A device for conducting concealment of frame erasure caused by frames of an encoded sound signal erased during transmission from an encoder to a decoder, comprising:

in the encoder, a determiner of concealment/recovery parameters selected from the group consisting of a signal classification parameter, an energy information parameter and a phase information parameter related to the sound signal; and a communication link for transmitting to the decoder concealment/recovery parameters determined in the encoder;

wherein:

the decoder conducts frame erasure concealment and decoder recovery in response to concealment/recovery parameters received from the encoder; and for conducting frame erasure concealment and decoder recovery:

the decoder controls an energy of a synthesized sound signal produced by the decoder by scaling the synthesized sound signal to render an energy of said synthesized sound signal at the beginning of a first non erased frame received following frame erasure similar to an energy of said synthesized sound signal at the end of a last frame erased during said frame erasure; and the decoder converges the energy of the synthesized sound signal in the received first non erased frame to an energy corresponding to the received energy information parameter toward the end of said received first non erased frame while limiting an increase in energy.

18. A device as claimed in claim 17, wherein:

the sound signal is a speech signal;

the determiner of concealment/recovery parameters comprises a classifier of successive frames of the encoded sound signal as unvoiced, unvoiced transition, voiced transition, voiced, or onset; and when the first non erased frame received following frame erasure is classified as onset, the decoder, for conducting frame erasure concealment and decoder recovery, limits to a given value a gain used for scaling the synthesized sound signal.

19. A device as claimed in claim 17, wherein:

the sound signal is a speech signal;

the determiner of concealment/recovery parameters comprises a classifier of successive frames of the encoded sound signal as unvoiced, unvoiced transition, voiced transition, voiced, or onset; and the decoder makes a gain used for scaling the synthesized sound signal at the beginning of the first non erased frame received after frame erasure equal to a gain used at an end of said received first non erased frame:

during a transition from a voiced frame to an unvoiced frame, in the case of a last non erased frame received before frame erasure classified as voiced transition, voice or onset and a first non erased frame received after frame erasure classified as unvoiced; and during a transition from a non-active speech period to an active speech period, when the last non erased frame received before frame erasure is encoded as comfort noise and the first non erased frame received after frame erasure is encoded as active speech.

20. A device for conducting concealment of frame erasure caused by frames of an encoded sound signal erased during transmission from an encoder to a decoder, comprising:

in the encoder, a determiner of concealment/recovery parameters selected from the group consisting of a signal classification parameter, an energy information parameter and a phase information parameter related to the sound signal; and a communication link for transmitting to the decoder concealment/recovery parameters determined in the encoder;

wherein:

the decoder conducts frame erasure concealment and decoder recovery in response to the concealment/recovery parameters received from the encoder;

the energy information parameter is not transmitted from the encoder to the decoder; and when a gain of a LP filter of a first non erased frame received following frame erasure is higher than a gain of a LP filter of a last frame erased during said frame erasure, the decoder adjusts an energy of an LP filter excitation signal produced in the decoder during the received first non erased frame to a gain of the LP filter of said received first non erased frame.

21. A device as claimed in claim 20, wherein:

the decoder, for adjusting the energy of the LP filter excitation signal produced in the decoder during the received first non erased frame to the gain of the LP filter of said received first non erased frame, uses the following relation:

$$E_q = E_1 \frac{E_{LP0}}{E_{LP1}}$$

where $E_1$ is an energy at an end of a current frame, $E_{LPO}$ is an energy of an impulse response of a LP filter of a last non erased frame received before the frame erasure, and $E_{LP1}$ is an energy of an impulse response of the LP filter of the received first non erased frame following frame erasure.

22. A device for conducting concealment of frame erasure caused by frames of an encoded sound signal erased during transmission from an encoder to a decoder, comprising:

in the encoder, a determiner of concealment/recovery parameters selected from the group consisting of a signal classification parameter, an energy information parameter and a phase information parameter related to the sound signal; and a communication link for transmitting to the decoder concealment/recovery parameters determined in the encoder;

wherein:

the concealment/recovery parameters include the phase information parameter;

to determine the phase information parameter, the determiner comprises a searcher of a position of a first glottal pulse in a frame of the encoded sound signal; and the searcher encodes a shape, sign and amplitude of the first glottal pulse and the communication link transmits the encoded shape, sign and amplitude from the encoder to the decoder.

23. A device for conducting concealment of frame erasure caused by frames of an encoded sound signal erased during transmission from an encoder to a decoder, comprising:

in the encoder, a determiner of concealment/recovery parameters selected from the group consisting of a signal classification parameter, an energy information parameter and a phase information parameter related to the sound signal; and a communication link for transmitting to the decoder concealment/recovery parameters determined in the encoder;

wherein:

the concealment/recovery parameters include the phase information parameter;

to determine the phase information parameter, the determiner comprises a searcher of a position of a first glottal pulse in a frame of the encoded sound signal; and the searcher measures a sample of maximum amplitude within a pitch period as the first glottal pulse; and the determiner comprises a quantizer of the position of the sample of maximum amplitude within the pitch period.

24. A device for conducting concealment of frame erasure caused by frames of an encoded sound signal erased during transmission from an encoder to a decoder, comprising:

in the encoder, a determiner of concealment/recovery parameters selected from the group consisting of a signal classification parameter, an energy information parameter and a phase information parameter related to the sound signal; and a communication link for transmitting to the decoder concealment/recovery parameters determined in the encoder;

wherein:

the sound signal is a speech signal;

the determiner of concealment/recovery parameters comprises a classifier of successive frames of the encoded sound signal as unvoiced, unvoiced transition, voiced transition, voiced, or onset; and the determiner of concealment/recovery parameters comprises a computer of the energy information parameter in relation to a maximum of a signal energy for frames classified as voiced or onset, and in relation to an average energy per sample for other frames.

25. A device for the concealment of frame erasure caused by frames erased during transmission of a sound signal encoded under the form of signal-encoding parameters from an encoder to a decoder, wherein:

the decoder determines concealment/recovery parameters selected from the group consisting of a signal classification parameter, an energy information parameter and a phase information parameter related to the sound signal, for producing, upon occurrence of frame erasure, a replacement frame selected from the group consisting of a voiced frame, an unvoiced frame, and a frame defining a transition between voiced and unvoiced frames; and the decoder conducts erased frame concealment and decoder recovery in response to determined concealment/recovery parameters;

wherein:

the concealment/recovery parameters include the energy information parameter;

the energy information parameter is not transmitted from the encoder to the decoder; and the decoder, for conducting frame erasure concealment and decoder recovery when a gain of a LP filter of a first non erased frame received following frame erasure is higher than a gain of a LP filter of a last frame erased during said frame erasure, adjusts an energy of an LP filter excitation signal produced in the decoder during the received first non erased frame to a gain of the LP filter of said received first non erased frame using the following relation:

$$E_q = E_1 \frac{E_{LP0}}{E_{LP1}}$$

where $E_1$ is an energy at an end of a current frame, $E_{LPO}$ is an energy of an impulse response of a LP filter of a last non erased frame received before the frame erasure, and $E_{LP1}$ is an energy of an impulse response of the LP filter to the received first non erased frame following frame erasure.

* * * * *